United States Patent
Kwak et al.

(10) Patent No.: US 12,029,066 B2
(45) Date of Patent: Jul. 2, 2024

(54) ELECTROLUMINESCENT DISPLAY DEVICE INCLUDING REFLECTIVE LAYER

(71) Applicant: LG Display Co., Ltd., Seoul (KR)

(72) Inventors: Bongchoon Kwak, Paju-si (KR); UnSang Yu, Paju-si (KR); Jaehun Jun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 428 days.

(21) Appl. No.: 17/470,450

(22) Filed: Sep. 9, 2021

(65) Prior Publication Data

US 2022/0158132 A1  May 19, 2022

(30) Foreign Application Priority Data

Nov. 19, 2020 (KR) .................... 10-2020-0155435

(51) Int. Cl.
*H10K 50/856* (2023.01)
*G09G 3/3233* (2016.01)
*H10K 59/122* (2023.01)
*H10K 59/131* (2023.01)
*H10K 59/38* (2023.01)

(52) U.S. Cl.
CPC ......... *H10K 50/856* (2023.02); *H10K 59/122* (2023.02); *H10K 59/131* (2023.02); *H10K 59/38* (2023.02); *G09G 3/3233* (2013.01); *G09G 2300/0426* (2013.01); *G09G 2300/0809* (2013.01)

(58) Field of Classification Search
CPC .. H10K 50/856; H10K 59/131; H10K 59/123; G09G 2300/0426; G09G 2300/0809
See application file for complete search history.

(56) References Cited

U.S. PATENT DOCUMENTS

| | | | |
|---|---|---|---|
| 2016/0225828 A1* | 8/2016 | Lee | H10K 50/826 |
| 2020/0043986 A1* | 2/2020 | Kim | H10K 59/30 |
| 2020/0185650 A1* | 6/2020 | Lim | H10K 50/813 |
| 2021/0074953 A1* | 3/2021 | Kim | H10K 50/856 |
| 2021/0111312 A1* | 4/2021 | Chang | H10K 59/123 |

OTHER PUBLICATIONS

Extended European Search Report, European Patent Office Application No. 21198173.3, Mar. 15, 2022, 7 pages.

* cited by examiner

*Primary Examiner* — Nduka E Ojeh
(74) *Attorney, Agent, or Firm* — Fenwick & West LLP

(57) ABSTRACT

An electroluminescent display device comprises first to third subpixels each of which including a contact area and a light emission area, each subpixel provided with a first electrode, the first electrode extending from the light emission area to the contact area of each of the first to third subpixels; a first reflective layer provided in the light emission area of the first subpixel and electrically insulated from the first electrode of the first subpixel; a second reflective layer provided at least in the light emission area of the second subpixel; and a third reflective layer provided at least in the light emission area of the third subpixel.

18 Claims, 13 Drawing Sheets

ELECTROLUMINESCENT DISPLAY DEVICE INCLUDING REFLECTIVE LAYER

CROSS-REFERENCE TO RELATED APPLICATIONS

This application claims the benefit of Korean Patent Application No. 10-2020-0155435 filed on Nov. 19, 2020, which is hereby incorporated by reference as if fully set forth herein.

TECHNICAL FIELD

The present disclosure relates to an electroluminescent display device.

DESCRIPTION OF THE RELATED ART

An electroluminescent display device has a structure in which a light emitting layer is formed between an anode electrode and a cathode electrode, and is a device for displaying an image by allowing the light emitting layer to emit light through an electric field between the two electrodes.

The light emitting layer may be comprised of an organic material for emitting light by transiting exciton generated by combination of electrons and holes from an excited state to a ground state, or may be comprised of an inorganic material such as quantum dot.

The light emitting layer may be configured to emit light of respective colors different per subpixel, for example, red light, green light and blue light per subpixel, or may be configured to emit light of the same color per subpixel, for example, white light.

A method for improving light efficiency by embodying micro cavity per subpixel has been suggested in the related art.

However, as the anode electrode or the light emitting layer has a thickness different per subpixel to embody micro cavity per subpixel, it is difficult to control a process.

BRIEF SUMMARY

It is an object of the present disclosure to provide an electroluminescent display device that is easy to control a process while improving light efficiency by embodying micro cavity.

In accordance with an aspect of the present disclosure, the above and other objects can be accomplished by an electroluminescent display device comprising a substrate provided with a first subpixel, a second subpixel and a third subpixel; a circuit element layer provided on the substrate and including a driving thin film transistor provided in each of the first to third subpixels; a reflective layer provided above the circuit element layer, and including a first reflective layer provided in the first subpixel, a second reflective layer provided in the second subpixel and a third reflective layer provided in the third subpixel; a first electrode provided in each of the first subpixel, the second subpixel and the third subpixel and provided above the reflective layer, the first electrode of each subpixel electrically connecting with the driving thin film transistor of the subpixel through a contact electrode; a light emitting layer provided on the first electrode; and a second electrode provided on the light emitting layer, wherein the first electrode of the first subpixel is electrically connected with the driving thin film transistor of the first subpixel through a first contact electrode, and the first reflective layer is electrically insulated from the first electrode of the first subpixel and the first contact electrode.

In accordance with another aspect of the present disclosure, the above and other objects can be accomplished by an electroluminescent display device comprising first to third subpixels each of which including a contact area and a light emission area, each subpixel provided a first electrode, the first electrode extending from the light emission to the contact area of each pixel; a first reflective layer provided in the light emission area of the first subpixel and electrically insulated from the first electrode of the first subpixel; a second reflective layer provided at least in the light emission area of the second subpixel; a third reflective layer provided at least in the light emission area of the third subpixel.

In addition to the effects of the present disclosure as mentioned above, additional objects and features of the present disclosure will be clearly understood by those skilled in the art from the following description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
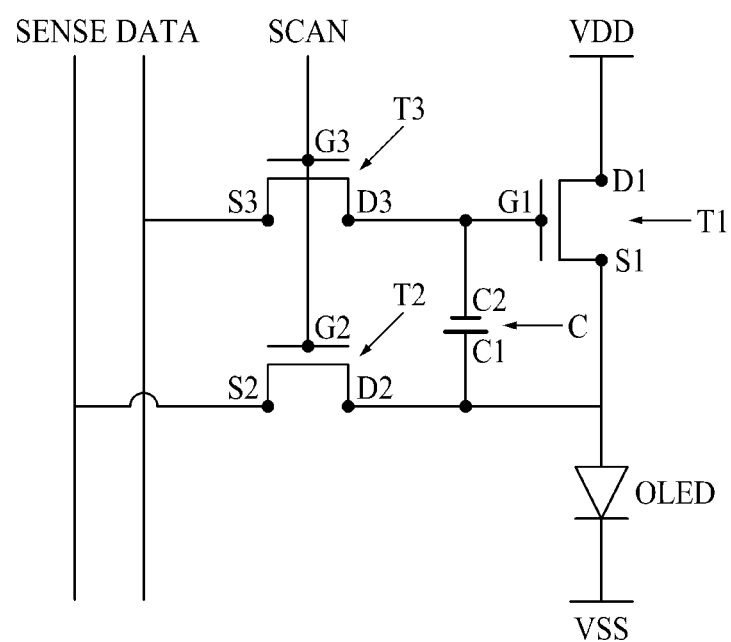
FIG. 1 is a circuit schematic view illustrating an electroluminescent display device according to one embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiment of the present disclosure will be described in detail with the accompanying drawings.

FIG. 1 is a circuit schematic view illustrating an electroluminescent display device according to one embodiment of the present disclosure.

As noted from FIG. 1, the electroluminescent display device according to one embodiment of the present disclosure includes a scan line SCAN, a high voltage power line VDD, a low voltage power line VSS, a data line DATA, a sense line SENSE, a driving thin film transistor T1, a sensing thin film transistor T2, a switching thin film transistor T3, a capacitor C, and an organic light emitting diode OLED.

The scan line SCAN supplies a gate signal to a gate electrode G2 of the sensing thin film transistor T2 and a gate electrode G3 of the switching thin film transistor T3.

The high voltage power line VDD supplies a high voltage power source to a drain electrode D1 of the driving thin film transistor T1.

The low voltage power line VSS supplies a low voltage power source to a second electrode of the organic light emitting diode OLED, for example, a cathode.

The data line DATA supplies a data signal to a source electrode S3 of the switching thin film transistor T3.

The sense line SENSE is connected to a source electrode S2 of the sensing thin film transistor T2.

The driving thin film transistor T1 is switched in accordance with a data voltage supplied from the switching thin film transistor T3 to generate a data current from the high voltage power source supplied from the high voltage power line VDD and supply the generated data current to the organic light emitting diode OLED.

The sensing thin film transistor T2 is intended to sense a threshold voltage difference of the driving thin film transistor T1, which causes deterioration of picture quality. The threshold voltage difference may be sensed in a sensing mode. The sensing thin film transistor T2 supplies a voltage of the driving thin film transistor T1 to the sense line SENSE in response to the gate signal supplied from the scan line SCAN.

The switching thin film transistor T3 is switched in accordance with the gate signal supplied to the scan line SCAN to supply the data voltage supplied from the data line DATA to the driving thin film transistor T1. The drain electrode D3 of the switching thin film transistor T3 is connected to the gate electrode G1 of the driving thin film transistor T1. It is shown that the sensing thin film transistor T2 and the switching thin film transistor T3 are connected to, but not limited to, the same scan line SCAN. The sensing thin film transistor T2 and the switching thin film transistor T3 may be connected to their respective scan lines SCAN different from each other.

The capacitor C maintains the data voltage supplied to the driving thin film transistor T1 for one frame. The capacitor C includes a first capacitor electrode C1 electrically connected to the source electrode S1 of the driving thin film transistor T1, and a second capacitor electrode C2 electrically connected to the gate electrode G1 of the driving thin film transistor T1. As the case may be, the first capacitor electrode C1 may be electrically connected to the drain electrode D1 of the driving thin film transistor T1, and this case may be applied equally to all of the following embodiments.

The organic light emitting diode OLED emits predetermined light in accordance with the data current supplied from the driving thin film transistor T1. The organic light emitting diode OLED includes an anode, a cathode, and a light emitting layer provided between the anode and the cathode. The anode of the organic light emitting diode OLED is connected to the source electrode S1 of the driving thin film transistor T1, and the cathode of the organic light emitting diode OLED is connected to the low voltage power line VSS.

Figure 2:
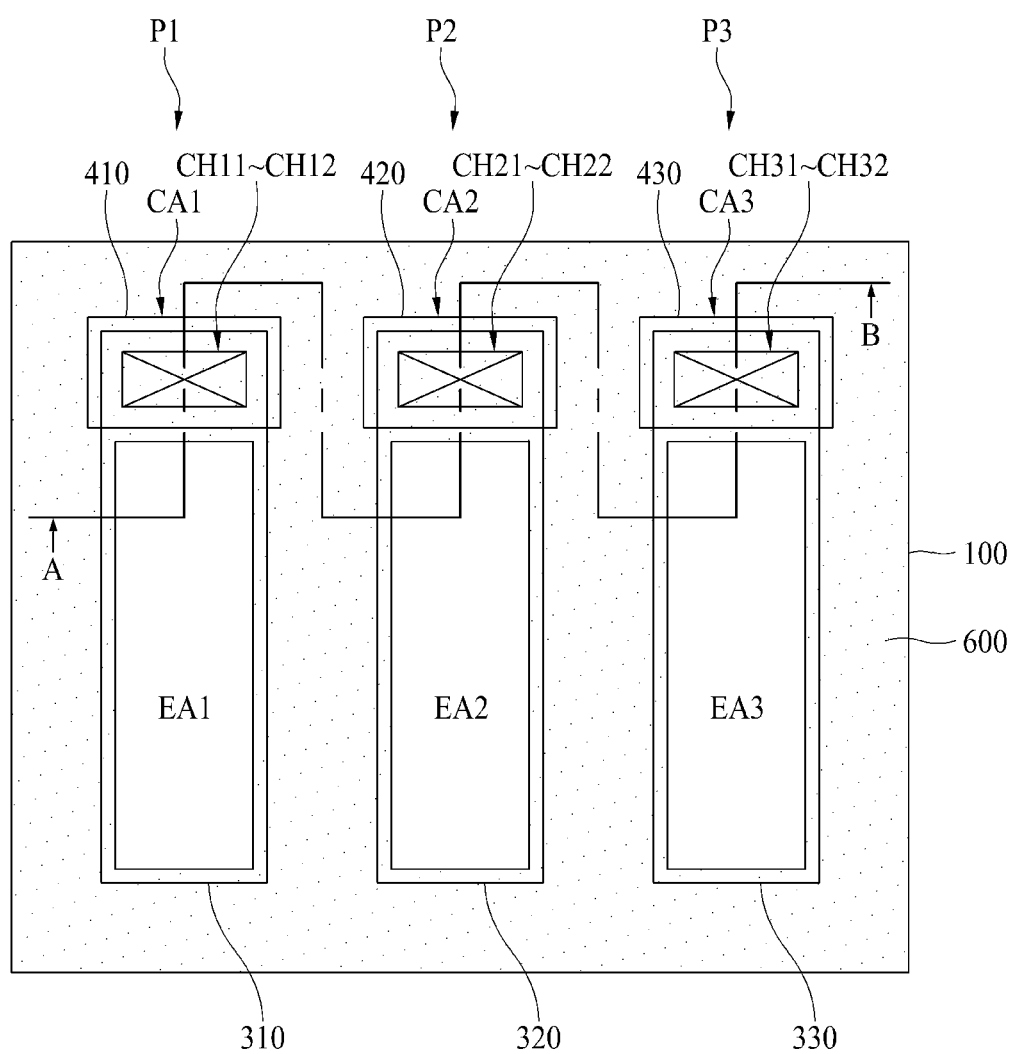
FIG. 2 is a plan view illustrating an electroluminescent display device according to one embodiment of the present disclosure.

FIG. 2 is a plan view illustrating an electroluminescent display device according to one embodiment of the present disclosure. Three subpixels are only shown in FIG. 2.

As noted from FIG. 2, the electroluminescent display device according to one embodiment of the present disclosure includes a substrate 100, first electrodes 310, 320 and 330, contact electrodes 410, 420 and 430, and a bank 600.

A plurality of subpixels P1, P2 and P3 are formed on the substrate 100.

The plurality of subpixels P1, P2 and P3 are provided with a plurality of light emission areas EA1, EA2 and EA3 and a plurality of contact areas CA1, CA2 and CA3.

In detail, the first light emission area EA1 and the first contact area CA1 are provided in the first subpixel P1, the second light emission area EA2 and the second contact area CA2 are provided in the second subpixel P2, and the third light emission area EA3 and the third contact area CA3 are provided in the third subpixel P3.

The plurality of light emission areas EA1, EA2 and EA3 are defined by the bank 600. In detail, areas exposed without being covered by the bank 600 become the plurality of light emission areas EA1, EA2 and EA3. The first light emission area EA1 may be comprised of a red light emission area, the second light emission area EA2 may be comprised of a green light emission area, and the third light emission area EA3 may be comprised of a blue light emission area, but they are not limited thereto.

The plurality of contact areas CA1, CA2 and CA3 may be provided in the area covered by the bank 600. Therefore, the plurality of contact areas CA1, CA2 and CA3 may be disposed outside one side of the plurality of light emission areas EA1, EA2 and EA3. For example, the first contact area CA1 may be provided outside an upper side of the first light emission area EA1, the second contact area CA2 may be provided outside an upper side of the second light emission area EA2, and the third contact area CA3 may be provided outside an upper side of the third light emission area EA3, but they are not limited thereto. The positions of the contact areas CA1, CA2 and CA3 may be changed in various ways.

The plurality of contact areas CA1, CA2 and CA3 are provided with a plurality of contact holes CH11 and CH12, CH21 and CH22, and CH31 and CH32, respectively, whereby a step difference is generated. Therefore, if the plurality of contact areas CA1, CA2 and CA3 are partially exposed without being covered by the bank 600 to partially overlap the plurality of light emission areas EA1, EA2 and EA3, a problem may occur in that the light emission areas EA1, EA2 and EA3 fail to uniformly emit light due to the step difference. Therefore, in one embodiment of the present disclosure, the plurality of contact areas CA1, CA2 and CA3 may be covered by the bank 600, whereby the plurality of contact areas CA1, CA2 and CA3 may be formed so as not to overlap the plurality of light emission areas EA1, EA2 and EA3. However, the plurality of contact areas CA1, CA2 and CA3 are not limited to the above embodiment. That is, at least a portion of the plurality of contact areas CA1, CA2 and CA3 may not be covered by the bank, whereby at least a portion of the plurality of contact areas CA1, CA2 and CA3 may be formed to overlap the plurality of light emission areas EA1, EA2 and EA3.

The first electrodes 310, 320 and 330 are formed to be patterned per subpixels P1, P2 and P3. That is, one first electrode 310 is formed in the first subpixel P1, another first electrode 320 is formed in the second subpixel P2, and the other first electrode 330 is formed in the third subpixel P3. The first electrodes 310, 320 and 330 may serve as anodes of the electroluminescent display device.

The first electrode 310 of the first subpixel P1 is extended from the first light emission area EA1 to the first contact area CA1, and the portion of the first electrode 310 exposed without being covered by the bank 600 becomes the first light emission area EA1. The first electrode 310 of the first subpixel P1 is connected with the first contact electrode 410 in the first contact area CA1.

The first electrode 320 of the second subpixel P2 is extended from the second light emission area EA2 to the second contact area CA2, and the portion of the first electrode 320 exposed without being covered by the bank 600 becomes the second light emission area EA2. The first electrode 320 of the second subpixel P2 is connected with the second contact electrode 420 in the second contact area CA2.

The first electrode 330 of the third subpixel P3 is extended from the third light emission area EA3 to the third contact area CA3, and the portion of the first electrode 330 exposed without being covered by the bank 600 becomes the third light emission area EA3. The first electrode 330 of the third subpixel P3 is connected with the third contact electrode 430 in the third contact area CA3.

The contact electrodes 410, 420 and 430 are provided in the contact areas CA1, CA2 and CA3 respectively. In detail, the first contact electrode 410 is provided in the first contact area CA1, the second contact electrode 420 is provided in the second contact area CA2, and the third contact electrode 430 is provided in the third contact area CA3.

The first contact electrode 410 is connected with the first electrode 310 while being overlapped with the first electrode 310 of the first subpixel P1 in the first contact area CA1. A left and right width of the first contact electrode 410 is greater than that of the first electrode 310 as shown, but is not limited thereto. That is, the left and right width of the first contact electrode 410 may be equal to or smaller than that of the first electrode 310.

The second contact electrode 420 is connected with the first electrode 320 while being overlapped with the first electrode 320 of the second subpixel P2 in the second contact area CA2. A left and right width of the second contact electrode 420 is greater than that of the first electrode 320 as shown, but is not limited thereto. That is, the left and right width of the second contact electrode 420 may be equal to or smaller than that of the first electrode 320.

The third contact electrode 430 is connected with the first electrode 330 while being overlapped with the first electrode 330 of the third subpixel P3 in the third contact area CA3. A left and right width of the third contact electrode 430 is greater than that of the first electrode 330 as shown, but is not limited thereto. That is, the left and right width of the third contact electrode 430 may be equal to or smaller than that of the first electrode 330.

Figure 3:
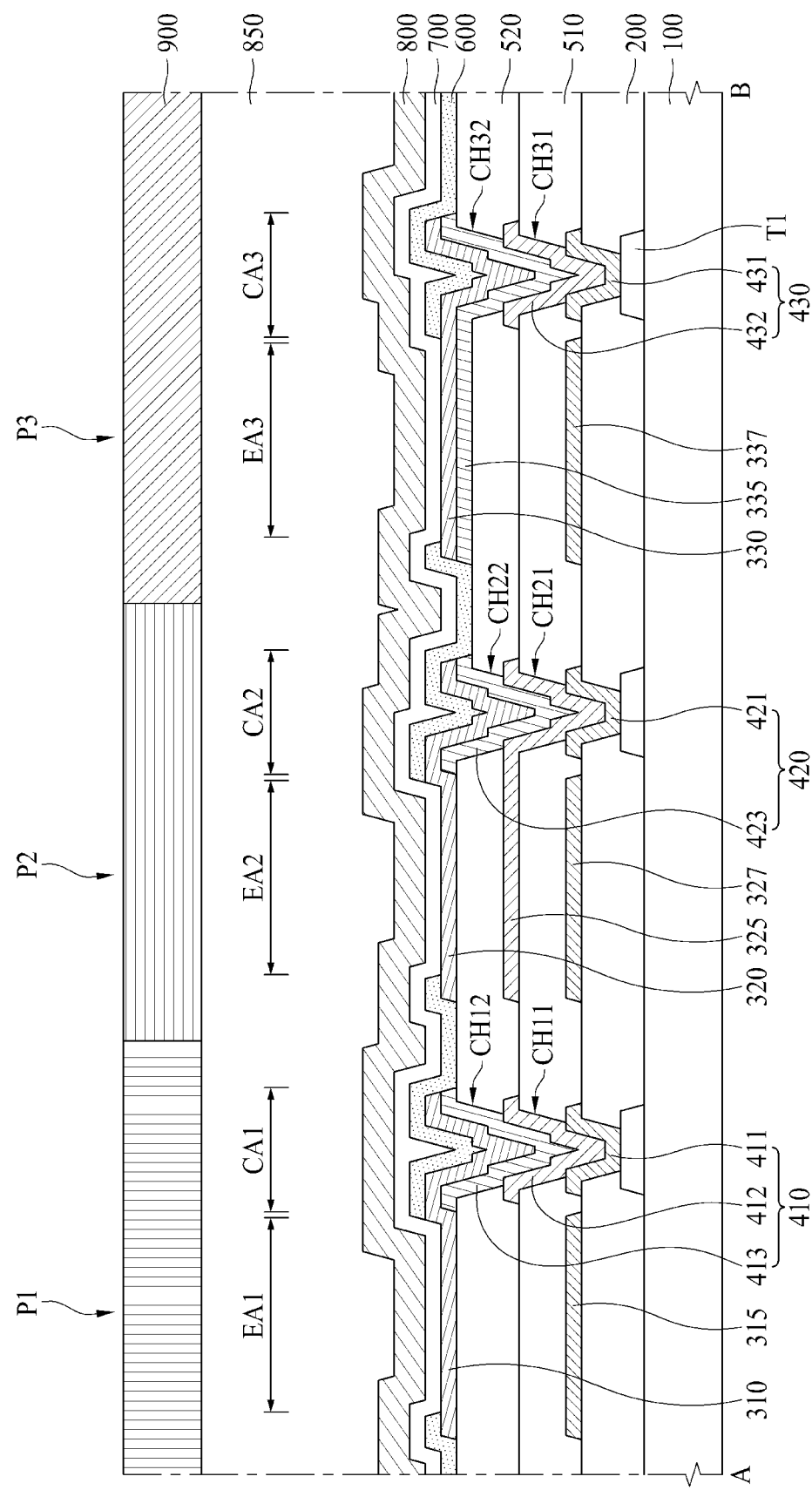
FIG. 3 is a cross-sectional view illustrating an electroluminescent display device according to one embodiment of the present disclosure, taken along line A-B of FIG. 2.

FIG. 3 is a cross-sectional view illustrating an electroluminescent display device according to one embodiment of the present disclosure, and corresponds to a cross-section of line A-B of FIG. 2.

As noted from FIG. 3, the electroluminescent display device according to one embodiment of the present disclosure includes a substrate 100, a circuit element layer 200, first electrodes 310, 320 and 330, reflective layers 315, 325 and 335, conductive layers 327 and 337, contact electrodes 410, 420 and 430, inter-layer dielectric layers 510 and 520, a bank 600, a light emitting layer 700, a second electrode 800, an encapsulation layer 850, and a color filter layer 900.

The substrate 100 may be made of, but not limited to, glass or plastic. The substrate 100 may be made of a semiconductor material such as silicon wafer. The substrate 100 may be made of a transparent material or an opaque material. The first subpixel P1, the second subpixel P2 and the third subpixel P3 are provided on the substrate 100. The first subpixel P1 may be provided to emit red light, the second subpixel P2 may be provided to emit green light, and the third subpixel P3 may be provided to emit blue light. The subpixels are not limited to the above case, and their arrangement sequence may be changed in various ways.

The electroluminescent display device according to one embodiment of the present disclosure is provided in a top emission in which light emits upwardly, and therefore an opaque material as well as a transparent material may be used as a material of the substrate 100.

The circuit element layer 200 is formed on the substrate 100.

A circuit element comprising the scan line SCAN, the high voltage power line VDD, the low voltage power line VSS, the data line DATA, the sense line SENSE, the driving thin film transistor T1, the sensing thin film transistor T2, the switching thin film transistor T3 and the capacitor C, which are described in FIG. 1, is provided in the circuit element layer 200 for each of the subpixels P1, P2 and P3.

The first electrodes 310, 320 and 330, the reflective layers 315, 325 and 335 and the contact electrodes 410, 420 and 430 are formed to be patterned for each of the subpixels P1, P2 and P3 on the circuit element layer 200. One first electrode 310, the first reflective layer 315 and the first contact electrode 410 are formed in the first subpixel P1, another first electrode 320, the second reflective layer 325 and the second contact electrode 420 are formed in the second subpixel P2, and the other first electrode 330, the third reflective layer 335 and the third contact electrode 430 are formed in the third subpixel P3.

The first electrode 310 is extended from the first light emission area EA1 to the first contact area CA1 in the first subpixel P1. The first contact electrode 410 provided in the first subpixel P1 includes a first lower contact electrode 411, a first center contact electrode 412 and a first upper contact electrode 413, and the first lower contact electrode 411, the first center contact electrode 412 and the first upper contact electrode 413 are formed in the first contact area CA1.

The first lower contact electrode 411 is provided on the circuit element layer 200, and is electrically connected to the driving thin film transistor T1 provided in the first subpixel P1. The first center contact electrode 412 is provided on the first inter-layer dielectric layer 510, and is connected to the first lower contact electrode 411 through the first contact hole CH11 of the first inter-layer dielectric layer 510 provided in the first subpixel P1. The first upper contact electrode 413 is provided on the second inter-layer dielectric layer 520, and is connected to the first center contact electrode 412 through the second contact hole CH12 of the second inter-layer dielectric layer 520 provided in the first subpixel P1. The first electrode 310 is provided on the second inter-layer dielectric layer 520 and the first upper contact electrode 413. Although not shown, the first electrode 310 may be connected with the first upper contact electrode 413 through a contact hole provided in a separate inter-layer dielectric layer.

The first reflective layer 315 is provided in the first light emission area EA1 on the circuit element layer 200 in the same manner as the first lower contact electrode 411. The first reflective layer 315 is electrically insulated from the first lower contact electrode 411 while being spaced apart from the first lower contact electrode 411. Therefore, the first reflective layer 315 is electrically insulated from the first electrode 310. In the first light emission area EA1 of the first subpixel P1, the first inter-layer dielectric layer 510 and the second inter-layer dielectric layer 520 are provided between the first reflective layer 315 and the first electrode 310.

The first reflective layer 315 may serve as a reflective layer for embodying micro cavity and also serve as a line or electrode of various circuit elements provided in the circuit element layer 200. That is, the first reflective layer 315 may be made of a line or electrode of various circuit elements provided in the circuit element layer 200 as a conductive layer, or may be electrically connected to the line or electrode.

The first electrode 320 provided in the second subpixel P2 is extended from the second light emission area EA2 to the second contact area CA2. The second contact electrode 420 provided in the second subpixel P2 includes a second lower contact electrode 421 and a second upper contact electrode 423, and the second lower contact electrode 421 and the second upper contact electrode 423 are formed in the second contact area CA2. The second reflective layer 325 is extended from the second light emission area EA2 to the second contact area CA2.

The second lower contact electrode 421 is provided on the circuit element layer 200, and is electrically connected to the driving thin film transistor T1 provided in the second subpixel P2. The second reflective layer 325 is provided on the first inter-layer dielectric layer 510, and is connected to the second lower contact electrode 421 through the first contact hole CH21 of the first inter-layer dielectric layer 510 provided in the second subpixel P2. The second upper contact electrode 423 is provided on the second inter-layer dielectric layer 520, and is connected to the second reflective layer 325 through the second contact hole CH22 of the second inter-layer dielectric layer 520 provided in the second subpixel P2. The first electrode 320 is provided on the second inter-layer dielectric layer 520 and the second upper contact electrode 423. Although not shown, the first electrode 320 may be connected with the second upper contact electrode 423 through a contact hole provided in a separate inter-layer dielectric layer.

The second reflective layer 325 is connected with the second lower contact electrode 421 and the second upper contact electrode 423, and therefore is electrically connected with the first electrode 320. The second reflective layer 325 serves as a reflective layer for embodying micro cavity. In the second light emission area EA2 of the second subpixel P2, the second inter-layer dielectric layer 520 is provided between the second reflective layer 325 and the first electrode 320.

The first electrode 330 provided in the third subpixel P3 is extended from the third light emission area EA3 to the third contact area CA3. The third contact electrode 430 provided in the third subpixel P3 includes a third lower contact electrode 431 and a third upper contact electrode 432, and the third lower contact electrode 431 and the third upper contact electrode 432 are formed in the third contact area CA3. The third reflective layer 335 is extended from the third light emission area EA3 to the third contact area CA3.

The third lower contact electrode 431 is provided on the circuit element layer 200, and is electrically connected to the driving thin film transistor T1 provided in the third subpixel P3. The third upper contact electrode 432 is provided on the first inter-layer dielectric layer 510, and is connected to the third lower contact electrode 431 through the first contact hole CH31 of the first inter-layer dielectric layer 510 provided in the third subpixel P3. The third reflective layer 335 is provided on the second inter-layer dielectric layer 520, and is connected to the third upper contact electrode 432 through the second contact hole CH32 of the second inter-layer dielectric layer 520 provided in the third subpixel P3. The first electrode 330 is provided on the third reflective layer 335. Although not shown, the first electrode 330 may be connected with the third reflective layer 335 through a contact hole provided in a separate inter-layer dielectric layer.

The third reflective layer 335 is electrically connected with the first electrode 330 while being in contact with a lower surface of the first electrode 330. The third reflective layer 335 serves as a reflective layer for embodying micro cavity. In the third light emission area EA3 of the third subpixel P3, no inter-layer dielectric layer is provided between the third reflective layer 335 and the first electrode 330.

As described above, according to one embodiment of the present disclosure, since a distance between the first reflective layer 315 and the first electrode 310 in the first subpixel P1, a distance between the second reflective layer 325 and the first electrode 320 in the second subpixel P2, and a distance between the third reflective layer 335 and the first electrode 330 in the third subpixel P3 are configured differently from one another, micro cavity characteristic may be obtained. In this case, the first electrodes 310, 320 and 330 may be made of transparent electrodes or semi-transparent electrodes, and may serve as anodes of the first to third subpixels P1, P2 and P3.

In the present disclosure, the reflective layer is a layer for reflecting incident light, the transparent electrode is an electrode for transmitting incident light, and the semi-transparent electrode is an electrode for transmitting a portion of incident light and reflecting the other portion of the incident light. Transparency is increasing in the order of the reflective layer, the semi-transparent electrode and the transparent electrode, and reflectivity is increasing in the order of the transparent electrode, the semi-transparent electrode and the reflective layer.

The conductive layers 327 and 337 include a first conductive layer 327 provided in the second subpixel P2, and a second conductive layer 337 provided in the third subpixel P3.

The first conductive layer 327 is provided in the second light emission area EA2 on the circuit element layer 200. The first conductive layer 327 is electrically insulated from the second lower contact electrode 421 while being spaced apart from the second lower contact electrode 421. Therefore, the first conductive layer 327 is electrically insulated from the second reflective layer 325 and the first electrode 320. The first conductive layer 327 may serve as a line or electrode of various circuit elements provided in the circuit element layer 200. That is, the first conductive layer 327 may be comprised of a line or electrode of various circuit elements provided in the circuit element layer 200, or may electrically be connected to the line or electrode.

The second conductive layer 337 is provided in the third light emission area EA3 on the circuit element layer 200. The second conductive layer 337 is electrically insulated from the third lower contact electrode 431 while being spaced apart from the third lower contact electrode 431. Therefore, the second conductive layer 337 is electrically insulated from the third reflective layer 335 and the first electrode 330. The second conductive layer 337 may serve as a line or electrode of various circuit elements provided in the circuit element layer 200. That is, the second conductive layer 337 may be comprised of a line or electrode of various circuit elements provided in the circuit element layer 200, or may electrically be connected to the line or electrode.

According to one embodiment of the present disclosure, the first reflective layer 315 and the conductive layers 327 and 337 are patterned to be respectively insulated from the first electrodes 310, 320 and 330 in the subpixels P1, P2 and P3, whereby it is advantageous that the first reflective layer 315 and the conductive layers 327 and 337 may be used as lines or electrodes of various circuit elements provided in the circuit element layer 200.

The first reflective layer 315 and the first lower contact electrode 411 of the first subpixel P1, the first conductive layer 327 and the second lower contact electrode 421 of the second subpixel P2, and the second conductive layer 337 and the third lower contact electrode 431 of the third subpixel P3, which are arranged on the same layer, are formed of the same material, and patterned through the same process.

The first center contact electrode 412 of the first subpixel P1, the second reflective layer 325 of the second subpixel P2, and the third upper contact electrode 432 of the third subpixel P3, which are arranged on the same layer, are formed of the same material and patterned through the same process.

The first upper contact electrode 413 of the first subpixel P1, the second upper contact electrode 423 of the second subpixel P2, and the third reflective layer 335 of the third subpixel P3, which are arranged on the same layer, are formed of the same material and patterned through the same process.

The first electrode 310 of the first subpixel P1, the first electrode 320 of the second subpixel P2, and the first electrode 330 of the third subpixel P3, which are arranged on the same layer, are formed of the same material and patterned through the same process.

In the present disclosure, the plurality of elements provided on the same layer may be formed of the same material and patterned through the same process.

The bank 600 may be formed on the second inter-layer dielectric layer 520 to cover ends of the first electrodes 310, 320 and 330, whereby a problem of light emission efficiency deteriorated by concentration of a current to the ends of the first electrodes 310, 320 and 330 may be solved.

The bank 600 is formed in each boundary among the plurality of subpixels P1, P2 and P3 in a matrix structure and defines the light emission areas EA1, EA2 and EA3 in the plurality of subpixels P1, P2 and P3, respectively. That is, in the respective subpixels P1, P2 and P3, exposed areas of the first electrodes 310, 320 and 330, which are exposed without the bank 600, become the light emission areas EA1, EA2 and EA3.

In this case, the bank 600 may be formed to overlap the contact areas CA1, CA2 and CA3 in which the contact electrodes 410, 420 and 430 are formed. Therefore, the contact areas CA1, CA2 and CA3, each of which has a step difference, may not be overlapped with the light emission areas EA1, EA2 and EA3.

Although the bank 600 may be made of an inorganic insulating film which is relatively thin, the bank 600 may be made of an organic insulating film which is relatively thick.

The light emitting layer 700 is formed on the first electrodes 310, 320 and 330. The light emitting layer 700 may be formed even on the bank 600. That is, the light emitting layer 700 is formed in each of the subpixels P1, P2 and P3 and each boundary area among the subpixels without being disconnected.

The light emitting layer 700 may be provided to emit white (W) light. To this end, the light emitting layer 700 may include a plurality of stacks emitting light of different colors. For example, the light emitting layer 700 may include a first stack emitting blue light, a second stack emitting yellow-green light, and a charge generation layer CGL provided between the first stack and the second stack, or may include a first stack emitting blue light, a second stack emitting green light, a third stack emitting red light, a first charge generation layer provided between the first stack and the second stack, and a second charge generation layer provided between the second stack and the third stack. Each stack may include a hole transporting layer, an organic light emitting layer and an electron transporting layer, which are deposited in due order. This configuration of the light emitting layer 700 may be modified in various types known in the art.

The second electrode 800 is formed on the light emitting layer 700. The second electrode 800 may serve as a cathode of the electroluminescent display device. The second electrode 800 is formed in each of the subpixels P1, P2 and P3 and each boundary area among the subpixels without being disconnected in the same manner as the light emitting layer 700. That is, the second electrode 800 may be formed even above the bank 600.

The second electrode 800 may be comprised of a semi-transparent electrode, and therefore micro cavity effect may be obtained for each of the subpixels P1, P2 and P3. That is, reflection and re-reflection of light are repeated between the second electrode 800 which is a semi-transparent electrode and the reflective layers 315, 325 and 335, whereby micro cavity effect may be obtained.

The encapsulation layer 850 is formed on the second electrode 800 to prevent external water from being permeated into the light emitting layer 700. The encapsulation layer 850 may be made of, but not limited to, an inorganic insulating material or a deposited structure of an inorganic insulating material and an organic insulating material, which are deposited alternately.

The color filter layer 900 is formed on the encapsulation layer 850. The color filter layer 900 is formed to face the light emission areas EA1, EA2 and EA3 in the individual subpixels P1, P2 and P3. The color filter layer 900 may include, but not limited to, a red color filter provided in the first subpixel P1, a green color filter provided in the second subpixel P2, and a blue color filter provided in the third subpixel P3. Although not shown, a black matrix may additionally be formed in a boundary between the color filter layers 900 to prevent light from leaking to the area other than the light emission areas EA1, EA2 and EA3.

Figure 4:
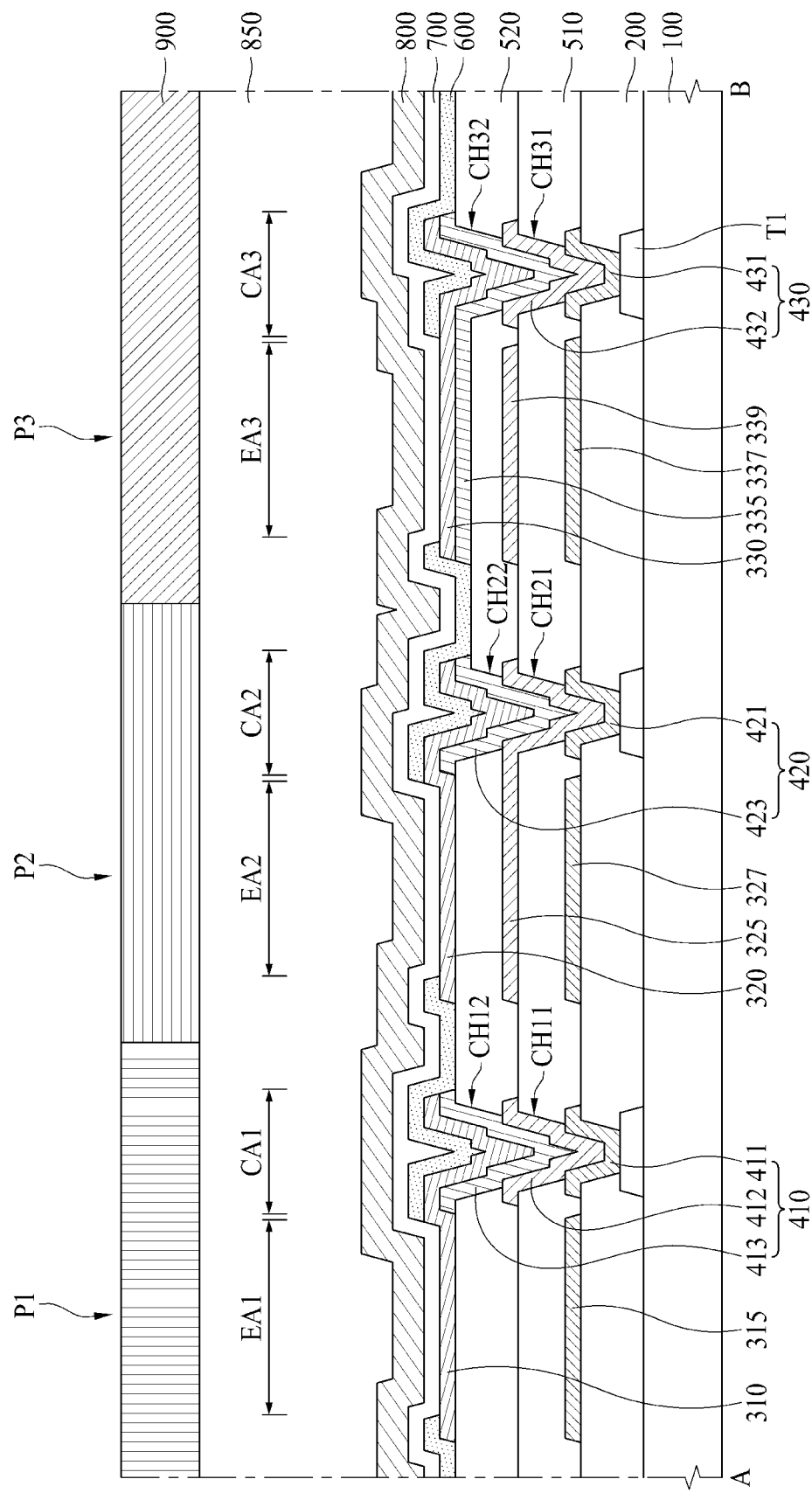
FIG. 4 is a cross-sectional view illustrating an electroluminescent display device according to another embodiment of the present disclosure, taken along line A-B of FIG. 2.

FIG. 4 is a cross-sectional view illustrating an electroluminescent display device according to another embodiment of the present disclosure, and corresponds to a cross-section of line A-B of FIG. 2. The electroluminescent display device of FIG. 4 is the same as the electroluminescent display device of FIG. 3 except that a third conductive layer 339 is additionally provided in the third subpixel P3. Therefore, the same reference numerals are given to the same elements, and different elements will only be described hereinafter.

As noted from FIG. 4, the third conductive layer 339 is provided on the first inter-layer dielectric layer 510 of the third subpixel P3. The third conductive layer 339 is formed of the same material as that of the third upper contact electrode 432 on the same layer as the third upper contact electrode 432 and patterned through the same process as that of the third upper contact electrode 432.

The third conductive layer 339 is provided in the third light emission area EA3. The third conductive layer 339 is electrically insulated from the third upper contact electrode 432 while being spaced apart from the third upper contact electrode 432. Therefore, the third conductive layer 339 is electrically insulated from the third reflective layer 335 and the first electrode 330. Also, the third conductive layer 339 is electrically insulated from the second conductive layer 337.

As described above, according to another embodiment of the present disclosure, the third conductive layer 339 is electrically insulated from the third reflective layer 335, the first electrode 330 and the second conductive layer 337, whereby it is advantageous that the third conductive layer 339 may be used as the line or electrode of various circuit elements provided in the circuit element layer 200 separately from the second conductive layer 337.

Figure 5:
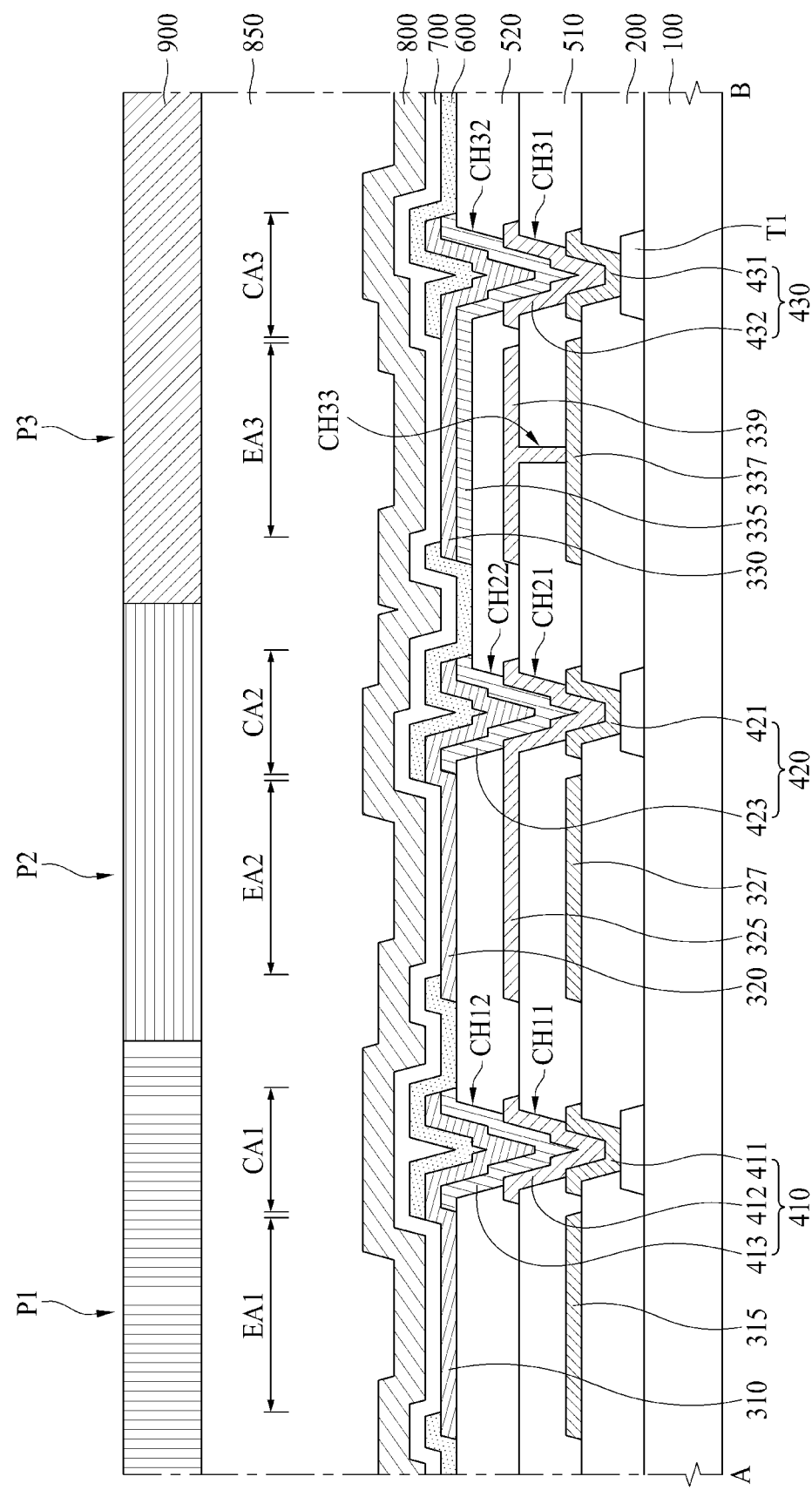
FIG. 5 is a cross-sectional view illustrating an electroluminescent display device according to still another embodiment of the present disclosure, taken along line A-B of FIG. 2.

FIG. 5 is a cross-sectional view illustrating an electroluminescent display device according to still another embodiment of the present disclosure, and corresponds to a cross-section of line A-B of FIG. 2. The electroluminescent display device of FIG. 5 is the same as the electroluminescent display device of FIG. 4 except that the third conductive layer 339 provided in the third subpixel P3 is electrically connected with the second conductive layer 337. Therefore, the same reference numerals are given to the same elements, and different elements will only be described hereinafter.

As noted from FIG. 5, the third conductive layer 339 is electrically connected with the second conductive layer 337 through a third contact hole CH33 provided in the first inter-layer dielectric layer 510.

Therefore, according to still another embodiment of the present disclosure, as the third conductive layer 339 is electrically connected with the second conductive layer 337, the third conductive layer 339 and the second conductive layer 337 may be used as the lines or electrodes of various circuit elements provided in the circuit element layer 200, whereby electric conductivity of the lines or electrodes may be improved.

Figure 6:
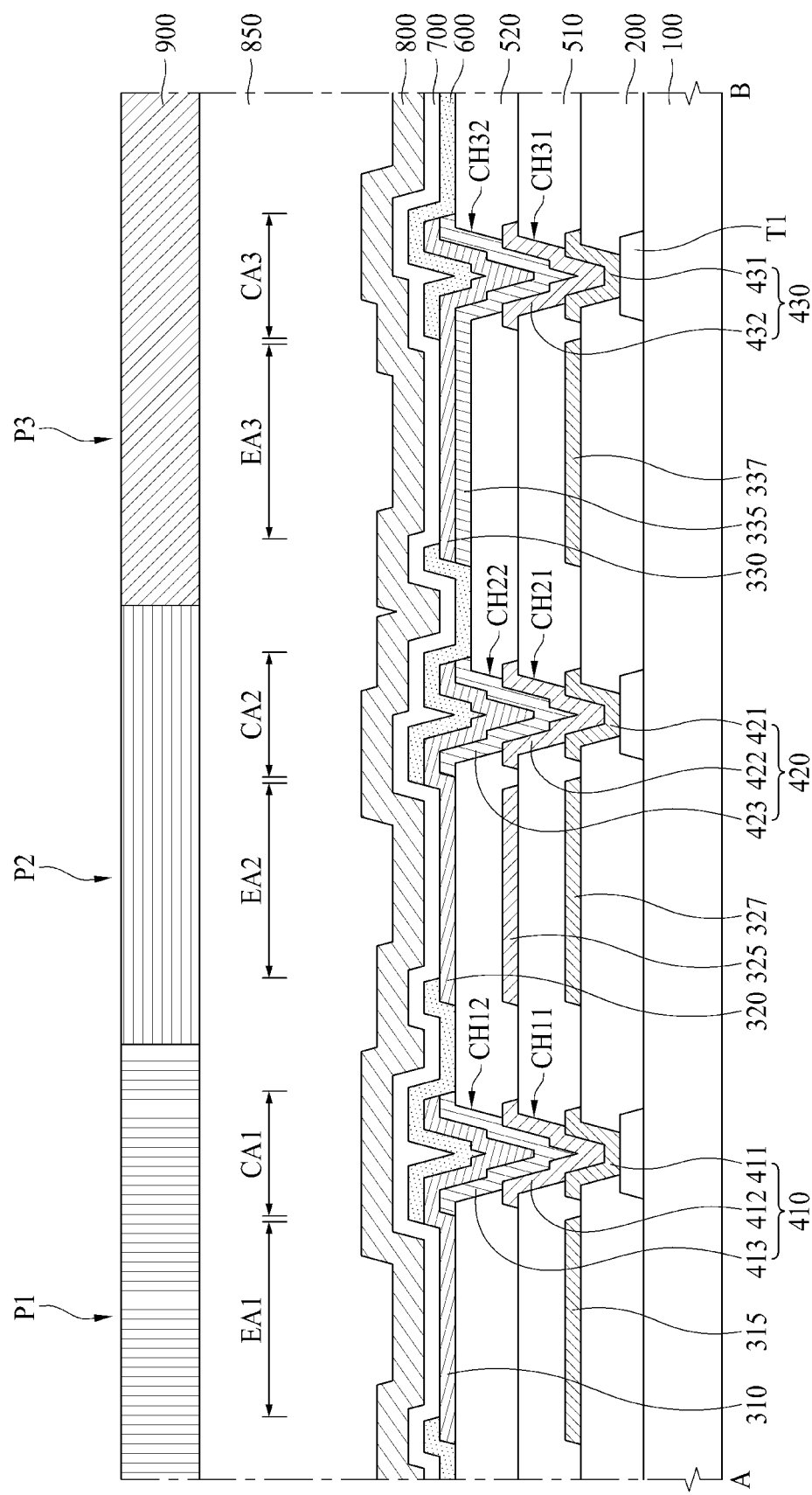
FIG. 6 is a cross-sectional view illustrating an electroluminescent display device according to still another embodiment of the present disclosure, taken along line A-B of FIG. 2.

FIG. 6 is a cross-sectional view illustrating an electroluminescent display device according to still another embodiment of the present disclosure, and corresponds to a cross-section of line A-B of FIG. 2. The electroluminescent display device of FIG. 6 is the same as the electroluminescent display device of FIG. 3 except that the second subpixel P2 is modified. Therefore, the same reference numerals are given to the same elements, and different elements will only be described hereinafter.

As noted from FIG. 6, the second reflective layer 325 and the second center contact electrode 422 are electrically insulated from each other while being spaced apart from each other on the first inter-layer dielectric layer 510.

The second reflective layer 325 is formed in the second light emission area EA2, and the second center contact electrode 422 is formed in the second contact area CA2.

Referring to FIG. 6, the second contact electrode 420 includes a second lower contact electrode 421, a second center contact electrode 422, and a second upper contact electrode 423. The second lower contact electrode 421 is provided on the circuit element layer 200, and is electrically connected to the driving thin film transistor T1 provided in the second subpixel P2. The second center contact electrode 422 is provided on the first inter-layer dielectric layer 510, and is connected to the second lower contact electrode 421 through the first contact hole CH21 of the first inter-layer dielectric layer 510 provided in the second subpixel P2. The second upper contact electrode 423 is provided on the second inter-layer dielectric layer 520, and is connected to the second center contact electrode 422 through the second contact hole CH22 of the second inter-layer dielectric layer 520 provided in the second subpixel P2.

The second reflective layer 325 is electrically insulated from the second contact electrode 420 and the first electrode 320. Also, the second reflective layer 325 is electrically insulated from the first conductive layer 327.

As described above, according to still another embodiment of the present disclosure, the second reflective layer 325 is electrically insulated from the second contact electrode 420, the first electrode 320 and the first conductive layer 327, whereby it is advantageous that the second reflective layer 325 may be used as the line or electrode of various circuit elements provided in the circuit element layer 200 separately from the first conductive layer 327.

Figure 7:
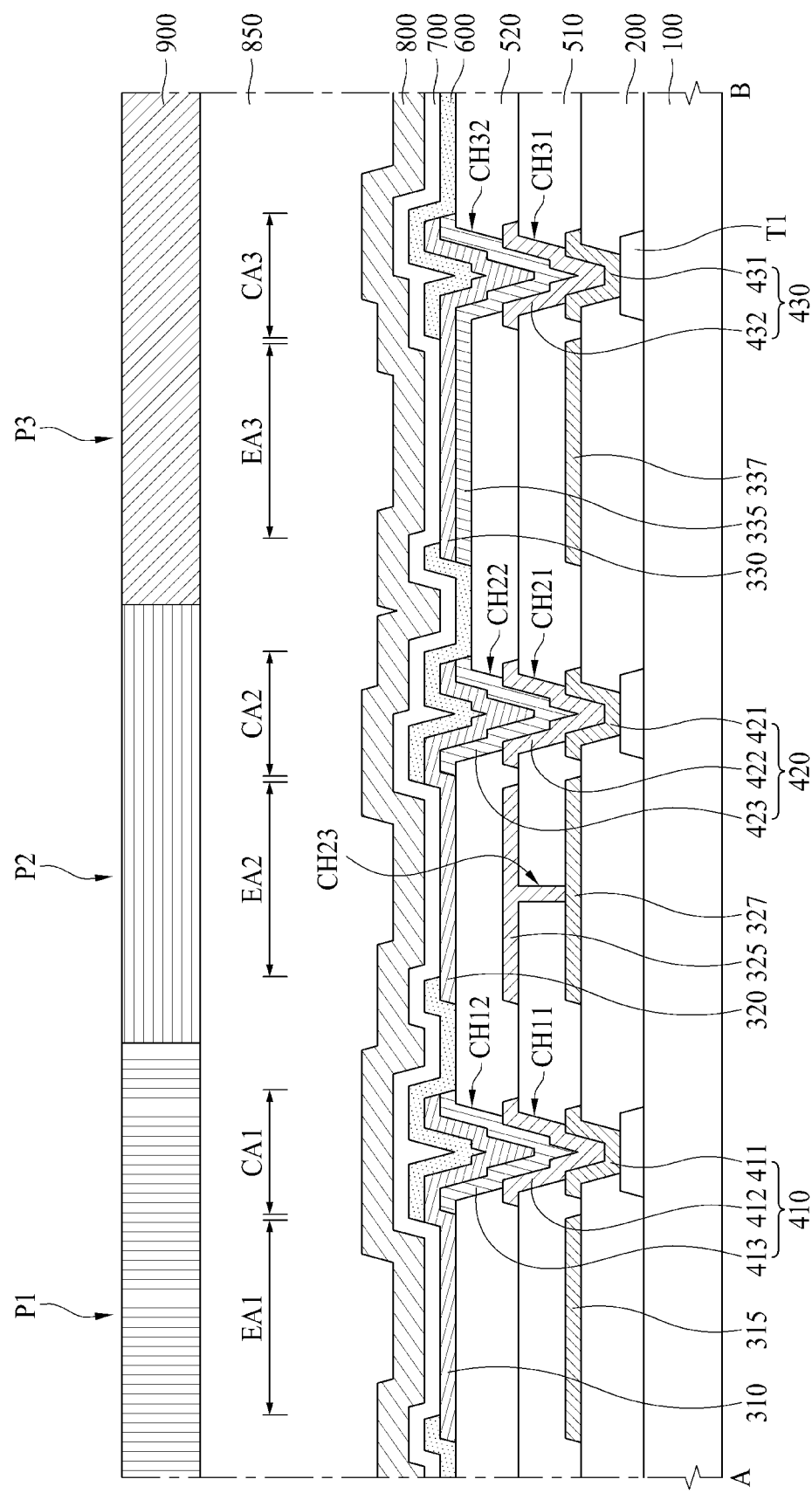
FIG. 7 is a cross-sectional view illustrating an electroluminescent display device according to still another embodiment of the present disclosure, taken along line A-B of FIG. 2.

FIG. 7 is a cross-sectional view illustrating an electroluminescent display device according to still another embodiment of the present disclosure, and corresponds to a cross-section of line A-B of FIG. 2. The electroluminescent display device of FIG. 7 is the same as the electroluminescent display device of FIG. 6 except that the second reflective layer 325 provided in the second subpixel P2 is electrically connected with the first conductive layer 327. Therefore, the same reference numerals are given to the same elements, and different elements will only be described hereinafter.

As noted from FIG. 7, the second reflective layer 325 is electrically connected with the first conductive layer 327 through a third contact hole CH23 provided in the first inter-layer dielectric layer 510.

Therefore, according to still another embodiment of the present disclosure, as the second reflective layer 325 is electrically connected with the first conductive layer 327, the second reflective layer 325 and the first conductive layer 327 may be used as the lines or electrodes of various circuit elements provided in the circuit element layer 200, whereby electric conductivity of the lines or electrodes may be improved.

Although not shown in detail, the present disclosure includes a structure in which the third conductive layer 339 of FIG. 4 or FIG. 5 is applied to the structure of FIG. 6 or FIG. 7.

Figure 8:
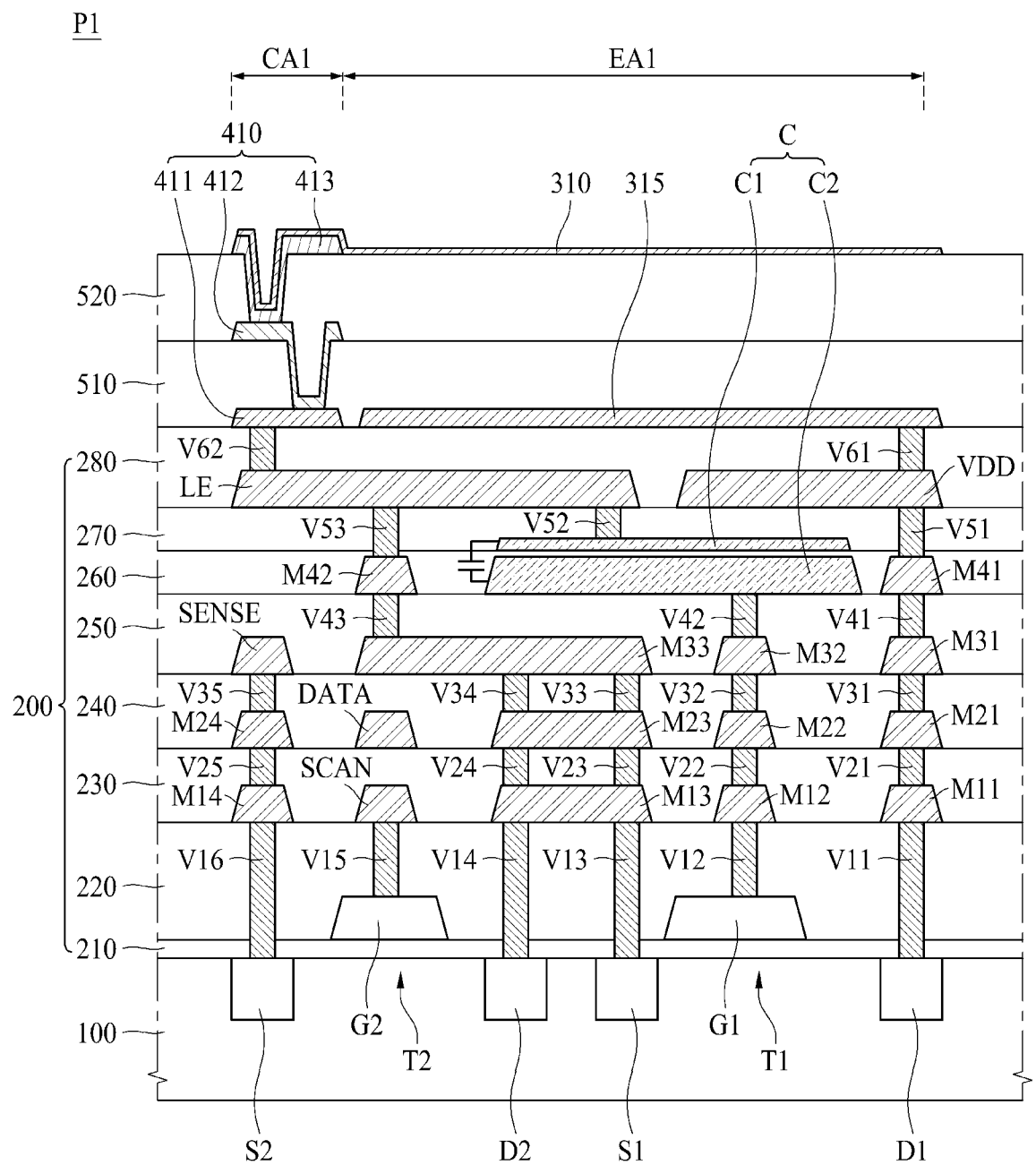
FIG. 8 is a cross-sectional view illustrating an electroluminescent display device according to still another embodiment of the present disclosure, specifically a circuit element layer of a first subpixel.

FIG. 8 is a cross-sectional view illustrating an electroluminescent display device according to further still another embodiment of the present disclosure, specifically a circuit element layer 200 of a first subpixel P1.

As noted from FIG. 8, a circuit element layer 200 is provided on a substrate 100, and a first electrode 310, a first contact electrode 410, a first reflective layer 315 and inter-layer dielectric layers 510 and 520 are provided on the circuit element layer 200.

The substrate 100 may be made of a semiconductor material.

Since the first electrode 310, the first contact electrode 410, the reflective layer 315 and the inter-layer dielectric layers 510 and 520, which are the same as those of FIGS. 3 to 7, are configured, their repeated description will be omitted.

The circuit element layer 200 includes a driving thin film transistor T1, a sensing thin film transistor T2, a scan line SCAN, a data line DATA, a sense line SENSE, a high voltage power line VDD, and a capacitor C.

The driving thin film transistor T1 includes a source electrode S1, a drain electrode D1, and a gate electrode G1. The source electrode S1 and the drain electrode D1 are provided in the substrate 100 made of a semiconductor material, and the gate electrode G1 is spaced apart from the source electrode S1 and the drain electrode D1 by interposing the first insulating layer 210 therebetween.

The sensing thin film transistor T2 includes a source electrode S2, a drain electrode D2, and a gate electrode G2. The source electrode S2 and the drain electrode D2 are provided in the substrate 100 made of a semiconductor material, and the gate electrode G2 is spaced apart from the source electrode S2 and the drain electrode D2 by interposing the first insulating layer 210 therebetween.

Although not shown, a switching thin film transistor may be provided in the same structure as that of the driving thin film transistor T1 or the sensing thin film transistor T2.

A second insulating layer 220 is formed on the first insulating layer 210 and the gate electrodes G1 and G2. The scan line SCAN and a plurality of first connection layers M11, M12, M13 and M14 are formed on the second insulating layer 220. Also, a plurality of first via holes V11, V12, V13, V14, V15 and V16 are formed in the second insulating layer 220 or the first and second insulating layers 210 and 220.

In detail, one first connection layer M11 is electrically connected with the drain electrode D1 of the driving thin film transistor T1 through the first via hole V11 passing through the first insulating layer 210 and the second insulating layer 220, and another first connection layer M12 is electrically connected with the gate electrode G1 of the driving thin film transistor T1 through the first via hole V12 passing through the second insulating layer 220. Still another first connection layer M13 is electrically connected with the source electrode S1 of the driving thin film transistor T1 and the drain electrode D2 of the sensing thin film transistor T2 through the first via holes V13 and V14 passing through the first insulating layer 210 and the second insulating layer 220. The scan line SCAN is electrically connected with the gate electrode G2 of the sensing thin film transistor T2 through the first via hole V15 passing through the second insulating layer 220. Further still another first connection layer M14 is electrically connected with the source electrode S2 of the sensing thin film transistor T2 through the first via hole V16 passing through the first insulating layer 210 and the second insulating layer 220.

A third insulating layer 230 is formed on the second insulating layer 220, the scan line SCAN and the plurality of first connection layers M11, M12, M13 and M14. And, the data line DATA and a plurality of second connection layers M21, M22, M23 and M24 are formed on the third insulating layer 230. Also, a plurality of second via holes V21, V22, V23, V24 and V25 are formed in the third insulating layer 230.

In detail, one second connection layer M21 is electrically connected with the first connection layer M11 through the second via hole V21 passing through the third insulating layer 230, another second connection layer M22 is electrically connected with the first connection layer M12 through the second via hole V22 passing through the third insulating layer 230, and still another second connection layer M23 is electrically connected with the first connection layer M13 through the second via holes V23 and V24 passing through the third insulating layer 230. The data line DATA is electrically connected with a source electrode of a switching thin film transistor through a first via hole, a first connection layer and a second via hole, which are not shown. Further still another second connection layer M24 is electrically connected with the first connection layer M14 through the second via hole V25 passing through the third insulating layer 230.

A fourth insulating layer 240 is formed on the third insulating layer 230, the data line DATA and the plurality of second connection layers M21, M22, M23 and M24. And, the sense line SENSE and a plurality of third connection layers M31, M32 and M33 are formed on the fourth insulating layer 240. Also, a plurality of third via holes V31, V32, V33, V34 and V35 are formed in the fourth insulating layer 240.

In detail, one third connection layer M31 is electrically connected with the second connection layer M21 through the third via hole V31 passing through the fourth insulating layer 240, another third connection layer M32 is electrically connected with the second connection layer M22 through the third via hole V32 passing through the fourth insulating layer 240, and still another third connection layer M33 is electrically connected with the second connection layer M23 through the third via holes V33 and V34 passing through the fourth insulating layer 240. The sense line SENSE is electrically connected with another second connection layer M24 through the third via hole V35 passing through the fourth insulating layer 240.

A fifth insulating layer 250 is formed on the fourth insulating layer 240, the sense line SENSE and the plurality of third connection layers M31, M32 and M33. And, a second capacitor electrode C2 of the capacitor C and a plurality of fourth connection layers M41 and M42 are formed on the fifth insulating layer 250. Also, a plurality of fourth via holes V41, V42 and V43 are formed in the fifth insulating layer 250.

In detail, one fourth connection layer M41 is electrically connected with the third connection layer M31 through the fourth via hole V41 passing through the fifth insulating layer 250. The second capacitor electrode C2 is electrically connected with another third connection layer M32 through the fourth via hole V42 passing through the fifth insulating layer 250. Another fourth connection layer M42 is electrically connected with the third connection layer M33 through the fourth via hole V43 passing through the fifth insulating layer 250.

A sixth insulating layer 260 is formed on the fifth insulating layer 250, the second capacitor electrode C2 and the plurality of fourth connection layers M41 and M42. And, a first capacitor electrode C1 of the capacitor C is formed on the sixth insulating layer 260. The first capacitor electrode C1 faces the second capacitor electrode C2 by interposing the sixth insulating layer 260 therebetween. It is preferable that the sixth insulating layer 260 is thin to increase capacity of the capacitor C. Therefore, the sixth insulating layer 260 may be formed to be thinner than the other insulating layers 210, 220, 230, 240, 250, 270 and 280.

A seventh insulating layer 270 is formed on the sixth insulating layer 260 and the first capacitor electrode C1. And, the high voltage power line VDD and a link electrode LE are formed on the seventh insulating layer 270. Also, a plurality of fifth via holes V51, V52 and V53 are formed in the seventh insulating layer 270 or the sixth and seventh insulating layers 260 and 270.

In detail, the high voltage power line VDD is electrically connected with the fourth connection layer M41 through the fifth via hole V51 passing through the sixth insulating layer 260 and the seventh insulating layer 270. The link electrode LE is electrically connected with the first capacitor electrode C1 through the fifth via hole V52 passing through the seventh insulating layer 270. Also, the link electrode LE is electrically connected with the fourth connection layer M42 through the fifth via hole V53 passing through the sixth insulating layer 260 and the seventh insulating layer 270.

An eighth insulating layer 280 is formed on the seventh insulating layer 270, the high voltage power line VDD and the link electrode LE. And, a first lower contact electrode 411 and a first reflective layer 315 are formed on the eighth insulating layer 280. Also, a plurality of sixth via holes V61 and V62 are formed in the eighth insulating layer 280.

The first lower contact electrode 411 is electrically connected with the link electrode LE through the sixth via hole V62 passing through the eighth insulating layer 280. The first reflective layer 315 is electrically connected with the high voltage power line VDD through the sixth via hole V61 passing through the eighth insulating layer 280.

Therefore, the first lower contact electrode 411 is electrically connected with each of the source electrode S1 of the driving thin film transistor T1 and the drain electrode D2 of the sensing thin film transistor T2 by passing through the link electrode LE, the fourth connection layer M42, the third connection layer M33, the second connection layer M23 and the first connection layer M13, which are arranged below the first lower contact electrode 411, in due order.

Also, the first reflective layer 315 is electrically connected with the drain electrode D1 of the driving thin film transistor T1 by passing through the high voltage power line VDD, the fourth connection layer M41, the third connection layer M31, the second connection layer M21 and the first connection layer M11, which are arranged below the first reflective layer 315, in due order.

Also, the first capacitor electrode C1 is electrically connected with each of the source electrode S1 of the driving thin film transistor T1 and the drain electrode D2 of the sensing thin film transistor T2 by passing through the link electrode LE arranged thereabove and then passing through the fourth connection layer M42, the third connection layer M33, the second connection layer M23 and the first connection layer M13, which are arranged below the first capacitor electrode C1, in due order.

Also, the second capacitor electrode C2 is electrically connected with the gate electrode G1 of the driving thin film transistor T1 by passing through the third connection layer M32, the second connection layer M22 and the first connection layer M12, which are arranged below the second capacitor electrode C2, in due order.

Also, the sense line SENSE is electrically connected with the source electrode S2 of the sensing thin film transistor T2 by passing through the second connection layer M24 and the first connection layer M14, which are arranged below the sense line SENSE, in due order.

According to still another embodiment of the present disclosure, the first reflective layer 315 is electrically connected with the high voltage power line VDD, whereby the first reflective layer 315 may serve as an auxiliary line of the high voltage power line VDD. As the case may be, the first reflective layer 315 may serve as a main high voltage power line.

Also, according to still another embodiment of the present disclosure, as the scan line SCAN, the data line DATA, the sense line SENSE and the high voltage power line VDD are formed on their respective layers different from one another, sizes of the plurality of subpixels P1, P2 and P3 may be reduced, whereby display of high resolution display may be embodied. Particularly, although the data line DATA may be provided above the scan line SCAN, the sense line SENSE may be provided above the data line DATA and the high voltage power line VDD may be provided above the sense line SENSE, these lines are not limited thereto.

Also, the first capacitor electrode C1 and the second capacitor electrode C2 may be formed on a layer different from the scan line SCAN, the data line DATA, the sense line SENSE and the high voltage power line VDD. However, as the case may be, at least two of the scan line SCAN, the data line DATA, the sense line SENSE, the first capacitor electrode C1, the second capacitor electrode C2 and the high voltage power line VDD may be formed on the same layer.

Although not shown in detail, the circuit element layer 200 may equally be applied to the second subpixel P2 and the third subpixel P3 of FIGS. 3 to 7.

In this case, in case of the second subpixel P2, the second lower contact electrode 421 is electrically connected with each of the source electrode S1 of the driving thin film transistor T1 and the drain electrode D2 of the sensing thin film transistor T2 by passing through the link electrode LE, the fourth connection layer M42, the third connection layer M33, the second connection layer M23 and the first connection layer M13 in due order, and the first conductive layer 327 is electrically connected with the drain electrode D1 of the driving thin film transistor T1 by passing through the high voltage power line VDD, the fourth connection layer M41, the third connection layer M31, the second connection layer M21 and the first connection layer M11 in due order.

In case of the third subpixel P3, the third lower contact electrode 431 is electrically connected with each of the source electrode S1 of the driving thin film transistor T1 and the drain electrode D2 of the sensing thin film transistor T2 by passing through the link electrode LE, the fourth connection layer M42, the third connection layer M33, the second connection layer M23 and the first connection layer M13 in due order, and the second conductive layer 337 is electrically connected with the drain electrode D1 of the driving thin film transistor T1 by passing through the high voltage power line VDD, the fourth connection layer M41, the third connection layer M31, the second connection layer M21 and the first connection layer M11 in due order.

Figure 9:
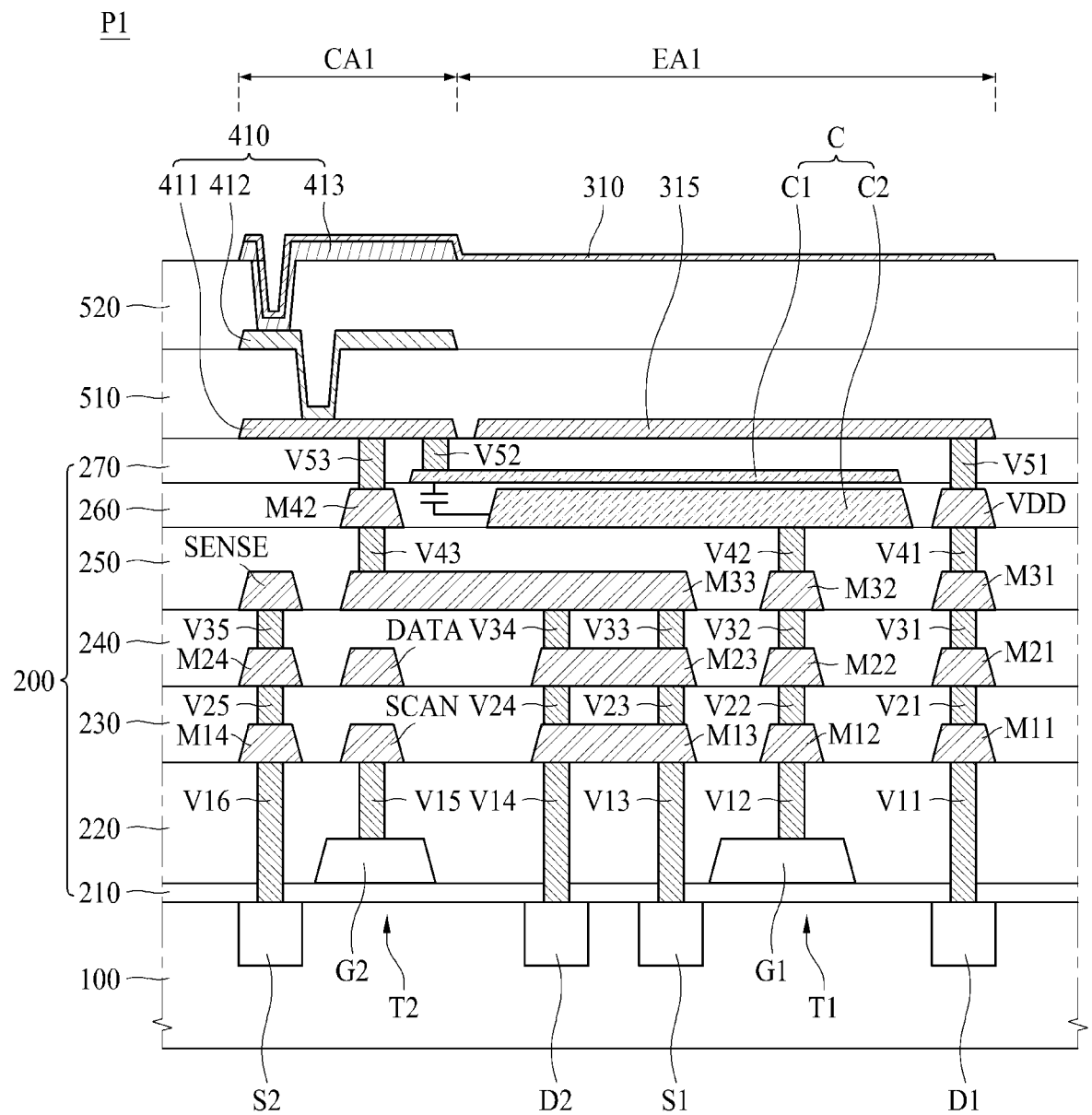
FIG. 9 is a cross-sectional view illustrating an electroluminescent display device according to still another embodiment of the present disclosure, specifically a circuit element layer of a first subpixel.

FIG. 9 is a cross-sectional view illustrating an electroluminescent display device according to still another embodiment of the present disclosure, specifically a circuit element layer 200 of a first subpixel P1. The electroluminescent display device of FIG. 9 is different from the electroluminescent display device of FIG. 8 in that the link electrode LE and the eighth insulating layer 280 are omitted. Therefore, the same reference numerals are given to the same elements, and different elements will only be described hereinafter.

Referring to FIG. 8, the high voltage power line VDD and the link electrode LE are formed on the seventh insulating layer 270, the eighth insulating layer 280 is formed on the high voltage power line VDD and the link electrode LE, and the first lower contact electrode 411 and the first reflective layer 315 are formed on the eighth insulating layer 280.

By contrast, referring to FIG. 9, the first lower contact electrode 411 and the first reflective layer 315 are formed on the seventh insulating layer 270. Therefore, the first lower contact electrode 411 is electrically connected with each of the source electrode S1 of the driving thin film transistor T1 and the drain electrode D2 of the sensing thin film transistor T2 by passing through the fourth connection layer M42, the third connection layer M33, the second connection layer M23 and the first connection layer M13, which are arranged below the first lower contact electrode 411, in due order. Also, the first capacitor electrode C1 is electrically connected with each of the source electrode S1 of the driving thin film transistor T1 and the drain electrode D2 of the sensing thin film transistor T2 by passing through the first lower contact electrode 411 arranged thereabove and then passing through the fourth connection layer M42, the third connection layer M33, the second connection layer M23 and the first connection layer M13, which are arranged below the first capacitor electrode C1, in due order.

Therefore, an upper surface of the first capacitor electrode C1 is in contact with a lower surface of the fifth via hole V52 provided in the seventh insulating layer 270, and a lower surface of the first lower contact electrode 411 is in contact with an upper surface of the fifth via hole V52 provided in the seventh insulating layer 270.

Also, referring to FIG. 9, the high voltage power line VDD is provided on the same layer as the second capacitor electrode C2 on the fifth insulating layer 250, and the first reflective layer 315 is electrically connected with the high voltage power line VDD arranged therebelow through the fifth via hole V51 provided in the seventh insulating layer 270 and the sixth insulating layer 260.

Therefore, the first reflective layer 315 is electrically connected with the drain electrode D1 of the driving thin film transistor T1 by passing through the high voltage power line VDD, the third connection layer M31, the second connection layer M21, and the first connection layer M11 in due order.

In this way, since the link electrode LE and the eighth insulating layer 280 are omitted in the embodiment of FIG. 9, it is advantageous that the number of deposition processes of a thin film and the number of patterning processes using a mask are reduced as compared with the embodiment of FIG. 8.

Figure 10:
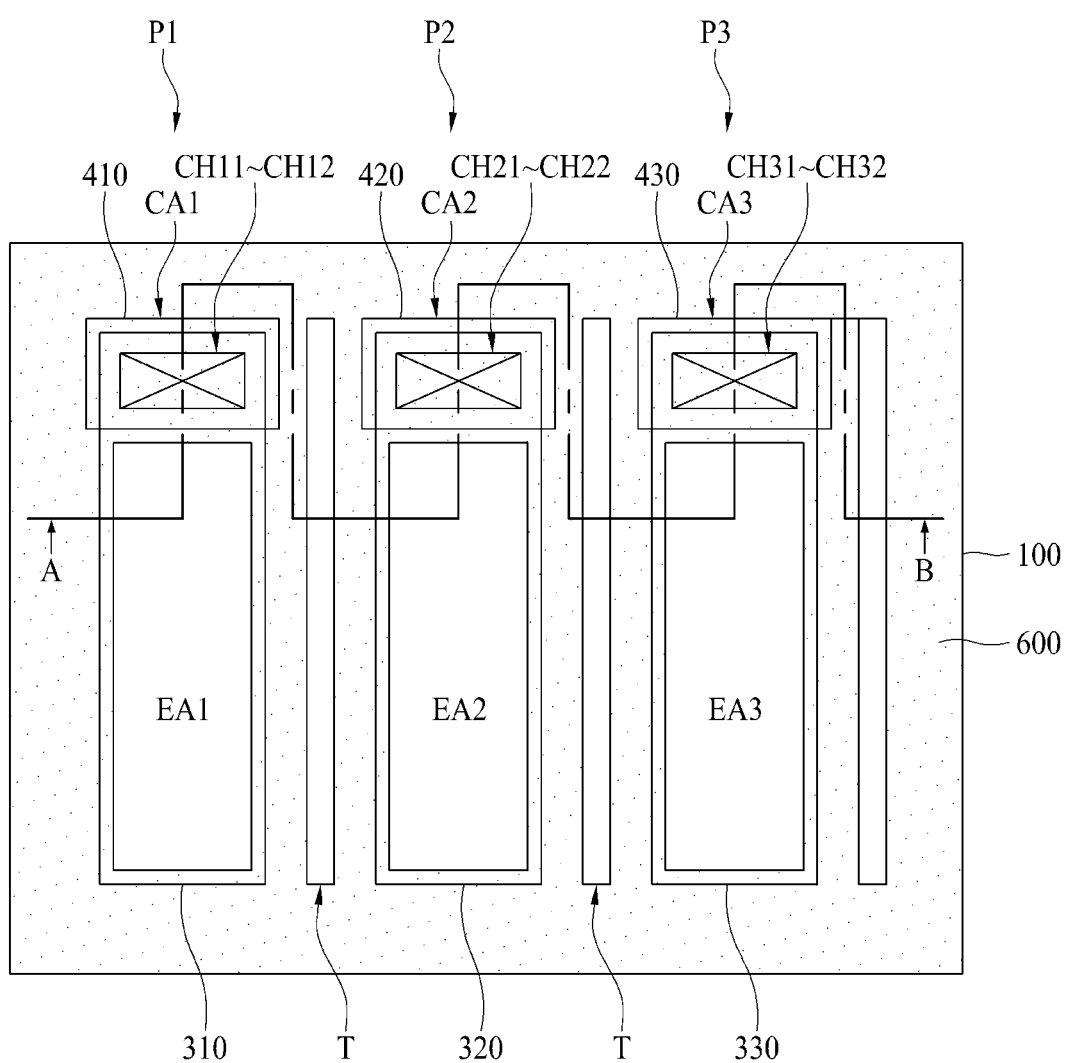
FIG. 10 is a plan view illustrating an electroluminescent display device according to another embodiment of the present disclosure.

FIG. 10 is a plan view illustrating an electroluminescent display device according to another embodiment of the present disclosure. The electroluminescent display device of FIG. 10 is different from the electroluminescent display device of FIG. 2 in that a trench T is additionally provided in each boundary among the plurality of subpixels P1, P2 and P3. Therefore, the same reference numerals are given to the same elements, and different elements will only be described hereinafter.

As noted from FIG. 10, a trench T is formed in each boundary area among the plurality of subpixels P1, P2 and P3. In this way, according to another embodiment of the present disclosure, as the trench T is provided, a current path is longitudinally formed among the subpixels P1, P2 and P3 adjacent to one another, whereby leakage current among the subpixels P1, P2 and P3 adjacent to one another may be reduced. This will be described in more detail through a sectional structure.

Figure 11:
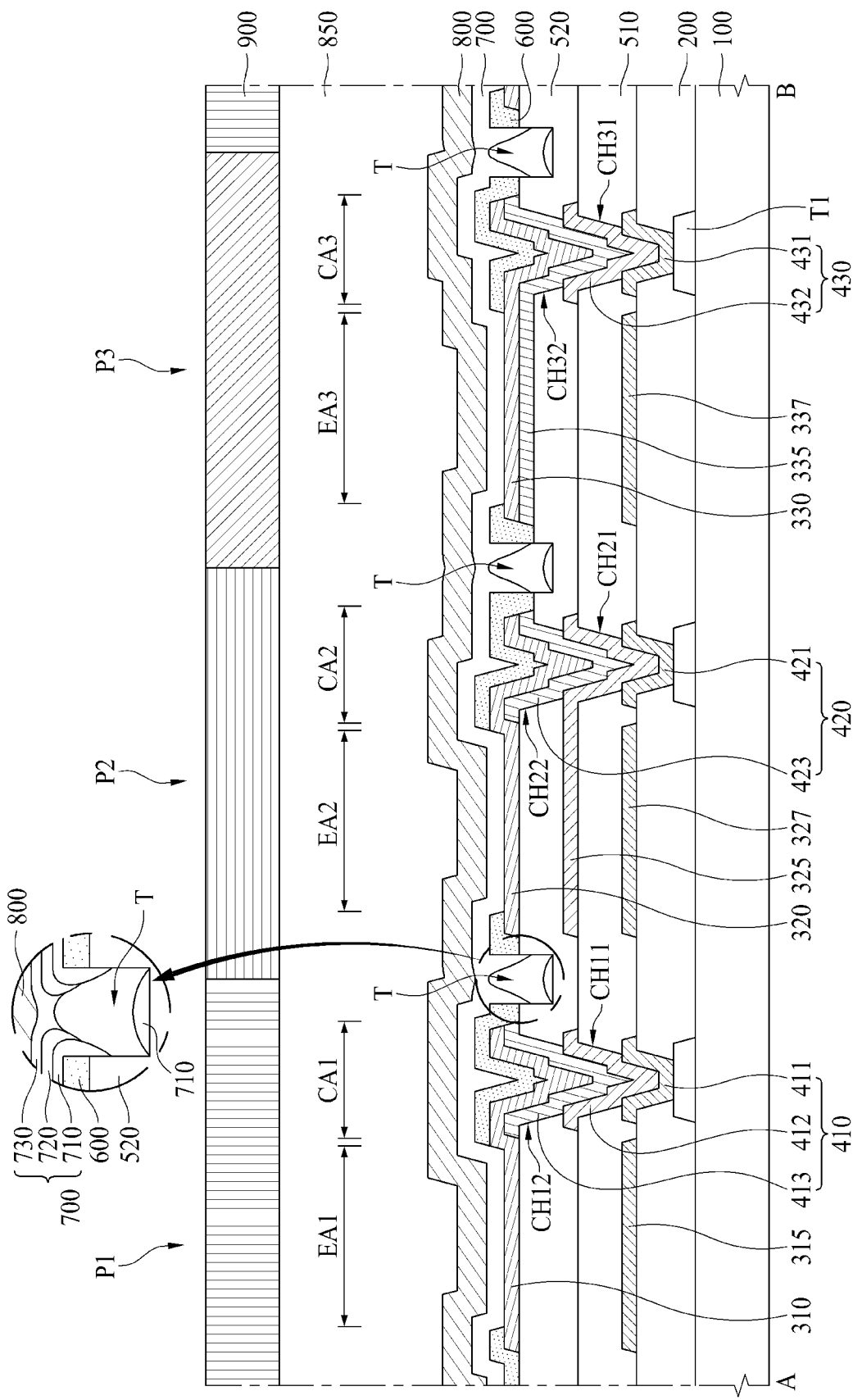
FIG. 11 is a cross-sectional view illustrating one embodiment along line A-B of FIG. 10.

FIG. 11 is a cross-sectional view illustrating one embodiment of line A-B of FIG. 10. The electroluminescent display device of FIG. 11 is different from the electroluminescent display device of FIG. 3 in that a trench T is additionally provided in a bank 600 and a second inter-layer dielectric layer 520 below the bank 600. Therefore, the same reference numerals are given to the same elements, and different elements will only be described hereinafter. Although not shown in detail, the trench T is also applied to the structure of FIGS. 4 to 9 in the present disclosure.

As noted from FIG. 11, a trench T is formed in the bank 600 and the second inter-layer dielectric layer 520 in each boundary area among the plurality of subpixels P1, P2 and P3.

In this way, according to another embodiment of the present disclosure, since the trench T is formed in the bank 600 and the second inter-layer dielectric layer 520, the light emitting layer 700 may be formed in the trench T. Therefore, a long current path may be formed among the subpixels P1, P2 and P3 adjacent to one another, whereby leakage current among the subpixels P1, P2 and P3 adjacent to one another may be reduced. That is, in the case that the intervals among the subpixels P1, P2 and P3 are compact to embody high resolution, when the light emitting layer 700 in any one of the subpixels P1, P2 and P3 emits light, charges in the corresponding light emitting layer 700 may move to the light emitting layer 700 in another one of the subpixels P1, P2 and P3 adjacent thereto, whereby a leakage current may occur.

Therefore, in another embodiment of the present disclosure, as the trench T is formed in each boundary area among the plurality of subpixels P1, P2 and P3 and the light emitting layer 700 is formed in the trench T, a long current path among the subpixels P1, P2 and P3 adjacent to one another is longitudinally formed to increase resistance, whereby occurrence of a leakage current may be reduced.

The trench T may be formed only in the bank 600. Alternatively, the trench T may be extended to the inside of the first inter-layer dielectric layer 510, or to the inside of the second inter-layer dielectric layer 520, or to the inside of the circuit element layer 200.

Referring to an enlarged view of FIG. 11, the light emitting layer 700 may include a first stack 710 emitting light of a first color, a second stack 730 emitting light of a second color, and a charge generation layer 720 provided between the first stack 710 and the second stack 730.

The first stack 710 may be formed at a side inside the trench T, and may also be formed on a lower surface inside the trench T. In this case, a portion of the first stack 710, which is formed at the side inside the trench T, and a portion of the first stack 710, which is formed on the lower surface inside the trench T, are disconnected from each other without being connected to each other. Therefore, a portion of the first stack 710, which is formed at one side inside the trench T, for example, a left side, and a portion of the first stack 710, which is formed at another side inside the trench T, for example, a right side are disconnected from each other without being connected to each other. As a result, charges cannot move among the subpixels P1, P2 and P3, which are arranged to adjoin one another by interposing the trench T, through the first stack 710.

Also, the charge generation layer 720 may be formed on the first stack 710 at the side inside the trench T. In this case, a portion of the charge generation layer 720, which is formed at one side inside the trench T, for example, a left side, and a portion of the charge generation layer 720, which is formed at another side inside the trench T, for example, a right side are disconnected from each other without being connected to each other. Therefore, charges cannot move among the subpixels P1, P2 and P3, which are arranged to adjoin one another by interposing the trench T, through the charge generation layer 720.

Also, the second stack 730 may be continuously provided among the subpixels P1, P2 and P3, which are arranged to adjoin one another by interposing the trench T, on the charge generation layer 720. Therefore, charges may move among the subpixels P1, P2 and P3, which are arranged to adjoin one another by interposing the trench T, through the second stack 730. However, without limitation to this case, the second stack 730 may be configured to be discontinuously provided among the subpixels P1, P2 and P3, which are arranged to adjoin one another by interposing the trench T, by properly controlling a shape of the trench T and a deposition process of the light emitting layer 700. Particularly, some lower portions of the second stack 730, which are adjacent to the charge generation layer 720, may be disconnected from each other among the subpixels P1, P2 and P3.

The charge generation layer 720 has conductivity greater than those of the first stack 710 and the second stack 730. Particularly, since an N type charge generation layer constituting the charge generation layer 720 may include a metal material, the N type charge generation layer has conductivity greater than those of the first stack 710 and the second stack 730. Therefore, charges mainly move among the subpixels P1, P2 and P3, which are arranged to adjoin one another, through the charge generation layer 720, and the amount of charges moving through the second stack 730 is insignificant.

According to another embodiment of the present disclosure, when the light emitting layer 700 is formed in the trench T, the light emitting layer 700 is provided to be partially disconnected in the trench T. Particularly, the first stack 710 and the charge generation layer 720 are provided to be disconnected, whereby a leakage current may be prevented from occurring among the subpixels P1, P2 and P3 which are adjacent to one another.

Figure 12A:
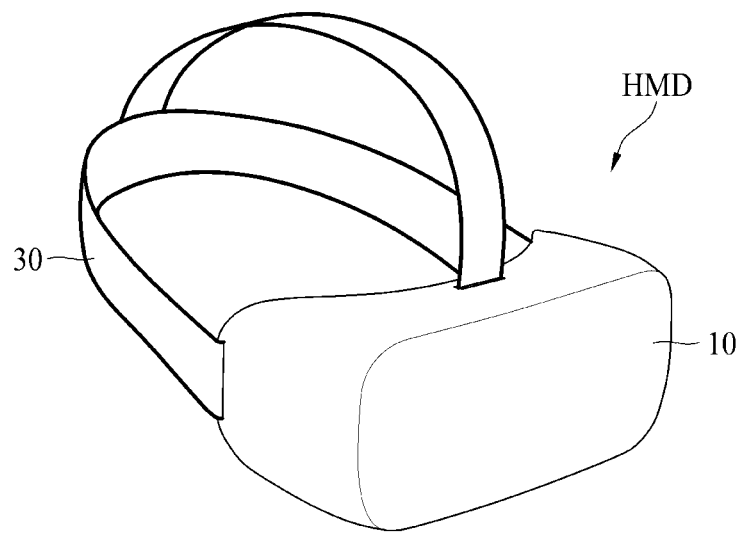
FIGS. 12A, 12B, and 12C are views illustrating an electroluminescent display device according to another embodiment of the present disclosure, and relate to a head-mounted display (HMD) device.
Figure 12B:
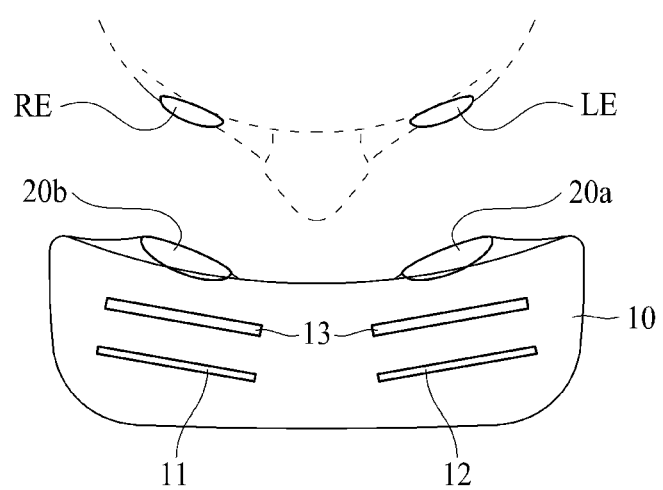
Figure 12C:
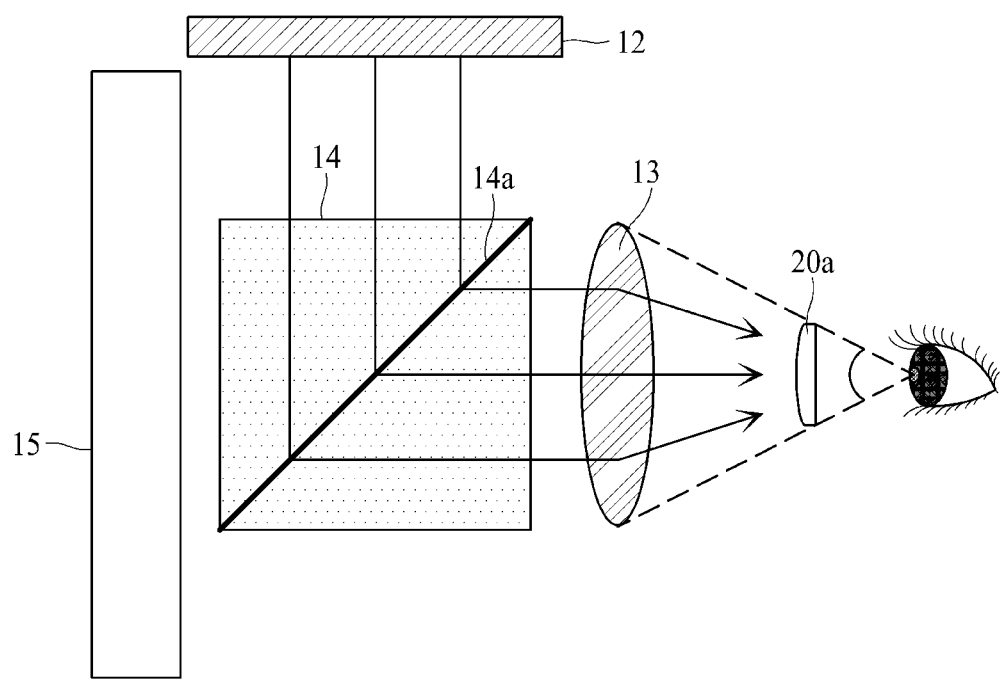

FIGS. 12A to 12C relate to an electroluminescent display apparatus according to another embodiment of the present disclosure and relate to a head-mounted display (HMD) apparatus. FIG. 12A is a schematic perspective view, FIG. 12B is a schematic plan view of a virtual reality (VR) structure, and FIG. 12C is a schematic cross-sectional view of an augmented reality (AR) structure.

As seen in FIG. 12A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface of both side surfaces of a user, but is not limited thereto. The head-mounted band 30 may fix the HMD apparatus to a head of a user and may be replaced by a glasses frame type structure or a helmet type structure.

As seen in FIG. 12B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus as explained above. In this case, an upper portion (for example, a color filter layer 900) corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20*a*, and a right eye RE of the user may be located at the right-eye eyepiece lens 20*b*.

As seen in FIG. 12C, an HMD apparatus having the AR structure according to the present disclosure may include a left-eye display apparatus 12, a lens array 13, a left-eye eyepiece lens 20*a*, a transmissive reflection part 14, and a transmissive window 15. In FIG. 12C, for convenience, only left-eye elements are illustrated, and right-eye elements may be the same as the left-eye elements.

The left-eye display apparatus 12, the lens array 13, the left-eye eyepiece lens 20*a*, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus as explained above. In this case, an upper portion (for example, a color filter layer 900) corresponding to a surface displaying an image may face the transmissive reflection part 14.

The lens array 13 may be provided between the left-eye eyepiece lens 20*a* and the transmissive reflection part 14.

The left eye of the user may be located at the left-eye eyepiece lens 20*a*.

The transmissive reflection part 14 may be disposed between the lens array 13 and the transmissive window 15. The transmissive reflection part 14 may include a reflection surface 14*a* which transmits a portion of light and reflects the other portion of the light. The reflection surface 14*a* may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to one embodiment of the present disclosure, as a first contact electrode is provided in a first subpixel, a second contact electrode is provided in a second subpixel and a third contact electrode is provided in a third subpixel, micro cavity may easily be embodied per subpixel by the first to third contact electrodes.

According to one embodiment of the present disclosure, as a first reflective layer is patterned to be insulated from a first electrode within the first subpixel, it is advantageous that the first reflective layer may be used as a line or electrode of various circuit elements provided in a circuit element layer.

According to one embodiment of the present disclosure, as a first conductive layer and a second conductive layer are patterned to be insulated from the first electrode within the second subpixel and the third subpixel, it is advantageous that the conductive layers may be used as lines or electrodes of various circuit elements provided in the circuit element layer.

According to another embodiment of the present disclosure, as a third conductive layer is patterned to be insulated from the first electrode within the third subpixel, it is advantageous that the third conductive layer and the second conductive layer may be used as lines or electrodes of various circuit elements provided in the circuit element layer.

According to still another embodiment of the present disclosure, as a second reflective layer is patterned to be insulated from the first electrode within the second subpixel, it is advantageous that the second reflective layer may be used as a line or electrode of various circuit elements provided in the circuit element layer.

According to still another embodiment of the present disclosure, as a scan line, a data line, a sense line, and a high voltage power line VDD are formed on their respective layers different from one another, sizes of a plurality of subpixels may be reduced, whereby display of high resolution may be embodied.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

What is claimed is:

1. An electroluminescent display device comprising:
a substrate provided with a first subpixel, a second subpixel and a third subpixel;
a circuit element layer provided on the substrate and including a driving thin film transistor provided in each of the first to third subpixels;
a reflective layer provided above the circuit element layer, and including a first reflective layer provided in the first subpixel, a second reflective layer provided in the second subpixel, and a third reflective layer provided in the third subpixel;
a first electrode provided in each of the first subpixel, the second subpixel, and the third subpixel and provided above the reflective layer, the first electrode of each of the first, second, and third subpixels electrically connecting with the corresponding driving thin film transistor of each of the first, second, and third subpixels through a corresponding contact electrode;
a first conductive layer provided below the second reflective layer in the second subpixel;
a light emitting layer provided on the first electrode; and
a second electrode provided on the light emitting layer,
wherein the first electrode of the first subpixel is electrically connected with the driving thin film transistor of the first subpixel through a first contact electrode, and the first reflective layer is electrically insulated from the first electrode of the first subpixel and the first contact electrode, and wherein the first conductive layer is made of the same material as that of the first reflective layer on the same layer as the first reflective layer and is electrically insulated from the first electrode of the second subpixel.

2. The electroluminescent display device of claim 1, wherein at least one of the first reflective layer and the second reflective layer is electrically connected with a line or electrode provided in the circuit element layer.

3. The electroluminescent display device of claim 1, wherein the first contact electrode includes a first lower contact electrode connected with the driving thin film transistor of the first subpixel, a first upper contact electrode connected with the first electrode of the first subpixel, and a first center contact electrode connecting the first lower contact electrode with the first upper contact electrode between the first lower contact electrode and the first upper contact electrode, and the first reflective layer is made of the same material as that of the first lower contact electrode on the same layer as the first lower contact electrode and is spaced apart from the first lower contact electrode.

4. The electroluminescent display device of claim 1, wherein the second reflective layer is provided between the first conductive layer and the first electrode of the second subpixel and is electrically connected with the first electrode of the second subpixel.

5. The electroluminescent display device of claim 1, wherein the second reflective layer is provided between the first conductive layer and the first electrode of the second subpixel, is electrically insulated from the first electrode of the second subpixel, and is electrically connected with the first conductive layer.

6. The electroluminescent display device of claim 1, wherein the second reflective layer is provided between the first conductive layer and the first electrode of the second subpixel, is electrically insulated from the first electrode of the second subpixel, and is electrically insulated from the first conductive layer.

7. The electroluminescent display device of claim 1, further comprising a second conductive layer provided below the third reflective layer in the third subpixel, wherein the second conductive layer is made of the same material as that of the first reflective layer on the same layer as the first reflective layer and is electrically insulated from the first electrode of the third subpixel.

8. The electroluminescent display device of claim 7, wherein the third reflective layer is provided between the second conductive layer and the first electrode of the third subpixel and is electrically connected with the first electrode of the third subpixel.

9. The electroluminescent display device of claim 7, further comprising a third conductive layer provided between the second conductive layer and the third reflective layer in the third subpixel, wherein the third conductive layer is made of the same material as that of the second reflective layer on the same layer as the second reflective layer and is electrically insulated from the second conductive layer, the third reflective layer and the first electrode of the third subpixel.

10. The electroluminescent display device of claim 7, further comprising a third conductive layer provided between the second conductive layer and the third reflective layer in the third subpixel, wherein the third conductive layer is made of the same material as that of the second reflective layer on the same layer as the second reflective layer and is electrically insulated from the third reflective layer and electrically connected with the second conductive layer.

11. The electroluminescent display device of claim 1, wherein the circuit element layer further includes a switching thin film transistor, a sensing thin film transistor, a data line electrically connected to a source electrode of the switching thin film transistor, a scan line electrically connected to a gate electrode of the sensing thin film transistor, a sense line electrically connected to a source electrode of the sensing thin film transistor, and a high voltage power line electrically connected to a drain electrode of the driving thin film transistor, and the data line, the scan line, the sense line and the high voltage power line are provided on their respective layers different from one another.

12. The electroluminescent display device of claim 1, further comprising a bank covering an end of the first electrode, wherein the bank is provided with a trench in each boundary area among the first to third subpixels, a portion of the light emitting layer is disconnected in the trench and the other portion of the light emitting layer is continuous in the trench.

13. An electroluminescent display device comprising:
a substrate provided with a first subpixel, a second subpixel and a third subpixel;
a circuit element layer provided on the substrate and including a driving thin film transistor provided in each of the first to third subpixels;
a reflective layer provided above the circuit element layer, and including a first reflective layer provided in the first subpixel, a second reflective layer provided in the second subpixel, and a third reflective layer provided in the third subpixel;
a first electrode provided in each of the first subpixel, the second subpixel, and the third subpixel and provided above the reflective layer, the first electrode of each of the first, second, and third subpixels electrically connecting with the corresponding driving thin film transistor of each of the first, second, and third subpixels through a corresponding contact electrode;
a light emitting layer provided on the first electrode; and
a second electrode provided on the light emitting layer,
wherein the first electrode of the first subpixel is electrically connected with the driving thin film transistor of the first subpixel through a first contact electrode, and the first reflective layer is electrically insulated from the first electrode of the first subpixel and the first contact electrode, and
wherein the circuit element layer includes a first capacitor electrode and a high voltage power line, which are provided in the first subpixel, the first contact electrode is electrically connected with the first capacitor electrode, and the first reflective layer is electrically connected with the high voltage power line.

14. An electroluminescent display device comprising:
first to third subpixels each of which including a contact area and a light emission area, each subpixel provided with a first electrode, the first electrode extending from the light emission area to the contact area of each of the first to third subpixels;
a first reflective layer provided in the light emission area of the first subpixel and electrically insulated from the first electrode of the first subpixel;
a second reflective layer provided at least in the light emission area of the second subpixel;
a third reflective layer provided at least in the light emission area of the third subpixel;

a first conductive layer provided in the light emission area of the second subpixel and provided below the second reflective layer; and a second conductive layer provided in the light emission area of the third subpixel and provided below the third reflective layer, wherein the first reflective layer, the first conductive layer and the second conductive layer are made of the same material on the same layer.

15. The electroluminescent display device of claim 14, further comprising a first lower contact electrode provided in the contact area of the first subpixel, a second lower contact electrode provided in the contact area of the second subpixel, and a third lower contact electrode provided in the contact area of the third subpixel, wherein the first lower contact electrode is electrically connected with the first electrode of the first subpixel and electrically insulated from the first reflective layer, the second lower contact electrode is electrically connected with the first electrode of the second subpixel and electrically insulated from the first conductive layer, the third lower contact electrode is electrically connected with the first electrode of the third subpixel and electrically insulated from the second conductive layer, and the first lower contact electrode, the second lower contact electrode and the third lower contact electrode are made of the same material as that of the first reflective layer on the same layer as the first reflective layer.

16. The electroluminescent display device of claim 14, further comprising a third conductive layer provided in the light emission area of the third subpixel and provided between the third reflective layer and the second conductive layer, wherein the third conductive layer is made of the same material as that of the second reflective layer on the same layer as the second reflective layer and is electrically insulated from the first electrode of the third subpixel.

17. The electroluminescent display device of claim 16, wherein at least one of the first conductive layer, the second conductive layer and the third conductive layer is electrically connected with a line or electrode provided in a circuit element layer.

18. The electroluminescent display device of claim 14, further comprising a bank covering an end of the first electrode, wherein the bank is provided with a trench in each boundary area among the first to third subpixels, a portion of a light emitting layer provided above the first electrode is disconnected in the trench and the other portion of the light emitting layer is continuous in the trench.

* * * * *